(12) United States Patent
Franks et al.

(10) Patent No.: US 12,334,231 B2
(45) Date of Patent: Jun. 17, 2025

(54) CONDUCTIVE ELEMENT

(71) Applicant: Quantum Conductors Ltd, East Farleigh (GB)

(72) Inventors: John Franks, East Farleigh (GB); Mathieu Delmas, East Farleigh (GB); Calvin Prentice, East Farleigh (GB)

(73) Assignee: Quantum Conductors Ltd, East Farleigh (GB)

( * ) Notice: Subject to any disclaimer, the term of this patent is extended or adjusted under 35 U.S.C. 154(b) by 338 days.

(21) Appl. No.: 17/277,239

(22) PCT Filed: Sep. 20, 2019

(86) PCT No.: PCT/GB2019/052652
§ 371 (c)(1),
(2) Date: Mar. 17, 2021

(87) PCT Pub. No.: WO2020/058728
PCT Pub. Date: Mar. 26, 2020

(65) Prior Publication Data
US 2021/0241942 A1 Aug. 5, 2021
US 2022/0148764 A2 May 12, 2022

(30) Foreign Application Priority Data

Sep. 20, 2018 (GB) .................................... 1815359

(51) Int. Cl.
*H01B 13/00* (2006.01)
*B82Y 30/00* (2011.01)
(Continued)

(52) U.S. Cl.
CPC ......... *H01B 13/0036* (2013.01); *C01B 32/16* (2017.08); *C01B 32/168* (2017.08);
(Continued)

(58) Field of Classification Search
CPC . C01B 2202/06; C01B 2202/08; C01B 32/16; C01B 32/168; C01B 32/158;
(Continued)

(56) References Cited

U.S. PATENT DOCUMENTS 9,031,626 B2   5/2015  Lin et al.
9,796,121 B2   10/2017 Shanov et al.
(Continued)

FOREIGN PATENT DOCUMENTS

CN   101748380 A   6/2010
CN   1720346 B     12/2011
(Continued)

OTHER PUBLICATIONS

Tawfick "Flexible High-Conductivity Carbon-Nanotube Interconnects Made by Rolling and Printing." small 2009, 5, No. 21, 2467-2473. (Year: 2009).*

(Continued)

*Primary Examiner* — Tri V Nguyen
(74) *Attorney, Agent, or Firm* — Kilpatrick Townsend & Stockton LLP

(57) ABSTRACT

Methods for producing a conductive element precursor and a conductive element, such as a tape or wire, are provided. The methods comprise growing a plurality of carbon nanotubes on a metallic substrate and coating carbon nanotubes of the plurality of carbon nanotubes on the metallic substrate with a metallic material.

17 Claims, 16 Drawing Sheets

(51) Int. Cl.

| | |
|---|---|
| *B82Y 40/00* | (2011.01) |
| *C01B 32/16* | (2017.01) |
| *C01B 32/168* | (2017.01) |
| *C08K 3/04* | (2006.01) |
| *C23C 16/26* | (2006.01) |
| *C23C 28/00* | (2006.01) |
| *C25D 5/54* | (2006.01) |
| *H01B 1/02* | (2006.01) |
| *H01B 1/04* | (2006.01) |
| *H01B 5/02* | (2006.01) |

(52) U.S. Cl.
CPC .............. *C08K 3/041* (2017.05); *C23C 16/26* (2013.01); *C23C 28/32* (2013.01); *C23C 28/34* (2013.01); *C25D 5/54* (2013.01); *H01B 1/026* (2013.01); *H01B 1/04* (2013.01); *H01B 5/02* (2013.01); *H01B 13/0016* (2013.01); *B82Y 30/00* (2013.01); *B82Y 40/00* (2013.01); *C01B 2202/06* (2013.01); *C01B 2202/08* (2013.01); *C01B 2202/22* (2013.01); *C01P 2004/03* (2013.01); *C08K 2201/001* (2013.01); *C08K 2201/011* (2013.01)

(58) Field of Classification Search
CPC ........... C23C 28/32; C23C 16/26; H01B 1/04; H01B 1/026; H01B 13/0036; B82Y 40/00; C08K 3/041; C25D 5/54
USPC ...................... 428/367; 977/842; 423/445 R
See application file for complete search history.

(56) References Cited

U.S. PATENT DOCUMENTS

| | | |
|---|---|---|
| 2009/0087543 A1 | 4/2009 | Nicholas |
| 2010/0320141 A1 | 12/2010 | Hauge et al. |
| 2010/0323207 A1 | 12/2010 | Pinault et al. |
| 2011/0135894 A1 | 6/2011 | Liu et al. |
| 2012/0267141 A1 | 10/2012 | Kamiyma et al. |
| 2013/0285289 A1 | 10/2013 | Feng et al. |
| 2013/0331271 A1 | 12/2013 | Lin et al. |
| 2014/0186546 A1 | 7/2014 | Wu et al. |
| 2015/0137414 A1 | 5/2015 | Shanov et al. |
| 2015/0376011 A1* | 12/2015 | Cooper ................ B01J 37/0215 427/249.1 |
| 2016/0118157 A1 | 4/2016 | Holesinger |
| 2016/0151817 A1 | 6/2016 | Nayfeh et al. |
| 2017/0018324 A1 | 1/2017 | Tokutomi et al. |
| 2018/0339492 A1* | 11/2018 | Aytug .................. C01B 32/174 |
| 2020/0090836 A1 | 3/2020 | Masquelier et al. |

FOREIGN PATENT DOCUMENTS

| | | |
|---|---|---|
| CN | 108511105 A | 9/2018 |
| EP | 3252778 A1 | 12/2017 |
| JP | 2005 263564 A | 9/2005 |
| JP | 2007 066532 A | 3/2007 |
| RU | 2 387 035 C1 | 4/2010 |
| RU | 2 447 526 C1 | 4/2012 |
| WO | 2007/117672 A2 | 10/2007 |
| WO | 2010/019333 A1 | 2/2010 |
| WO | 2013/127444 A1 | 9/2013 |
| WO | 2014/189549 A2 | 11/2014 |
| WO | 2016/117198 A1 | 7/2016 |
| WO | 2019/065089 A1 | 4/2019 |

OTHER PUBLICATIONS

Search Report mailed Oct. 23, 2018 in related application No. GB1815359.3, all pgs.
Office action containing a search report for Chinese Appln No. 2019800620819 dated Feb. 9, 2022, all pages.
First Examination Report from the Intellectual Property India for Appln No. 202117017386 mailed on Sep. 26, 2022, 6 pages.
Federal Service on Intellectual Property (FIIP) Search Report dated Apr. 20, 2023 for Appln No. 2021109707, 4 pages.
Federal Service on Intellectual Property (FIIP) Office Action dated Apr. 21, 2023 for Appln No. 2021109707, 9 pages.
International Search Report and Written Opinion mailed Mar. 26, 2020 in related application No. PCT/GB2019/052652, all pgs.
International Search Report and Written Opinion for PCT/GB2021/050712 dated Jun. 14, 2121, all pages.
Examination Report from the Intellectual Property Office of the United Kingdom for Appln No. GB2004267.7 dated Feb. 18, 2022, all pages.
Combined Search and Examination Report from the Intellectual Property Office of the United Kingdom for Appln No. GB2004267.7 dated May 20, 2020, all pages.
International Search Report and Written Opinion mailed Mar. 26, 2020 in PCT/GB2019/052652, all pages.
Canadian Application No. 3176752, "Examination Search Report", Mailed Mar. 27, 2024, 5 pages.
Indian Application No. 202117017386 , "First Examination Report", Sep. 26, 2022, 6 pages.
Application No. CN202180035921.X , Office Action, Mailed On Jun. 28, 2024, 17 pages.
CN202180035921.X , "Search Report", Jun. 28, 2024, 2 pages.
Application No. KR10-2021-7011679 , Office Action, Mailed On May 30, 2024, 9 pages.
Subramaniam, et al., "One hundred fold increase in current carrying capacity in a carbon nanotube-copper composite", Nature Communications, published Jul. 23, 2013, 7 pages.
Stano, et al., "Copper-Encapsulated Vertically Aligned Carbon nanotube Arrays", ACS Applied Materials & interfaces, vol. 5, Iss. 21, published Oct. 4, 2013, 8 pages.
Application No. EP24158707, "European Search Report", mailed Oct. 10, 2024, 6 pages.
Application No. EP21716521, "European Examination Report", mailed on Feb. 7, 2025, 3 pages.

* cited by examiner

Secondary electron image of a carbon nanotube forest fully infiltrated with copper

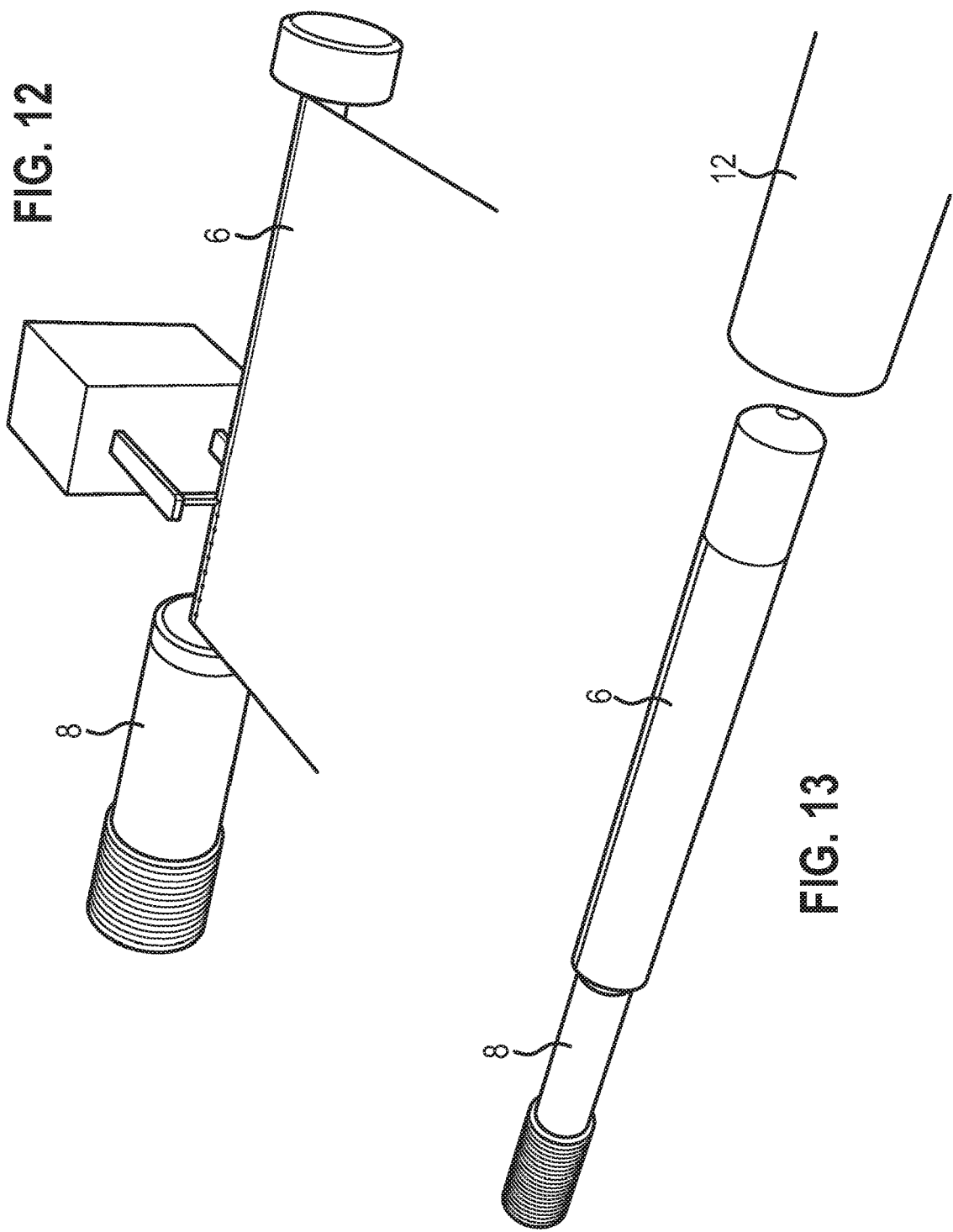

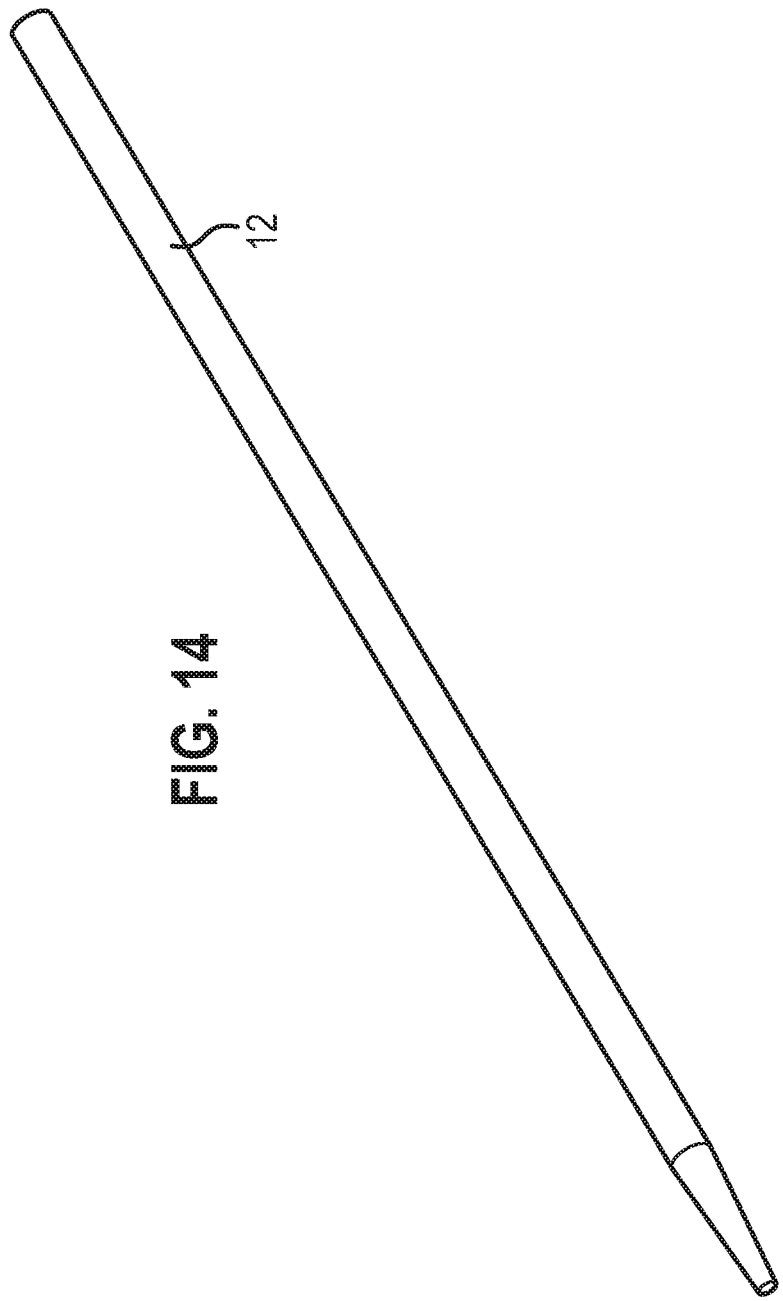

FIG. 18
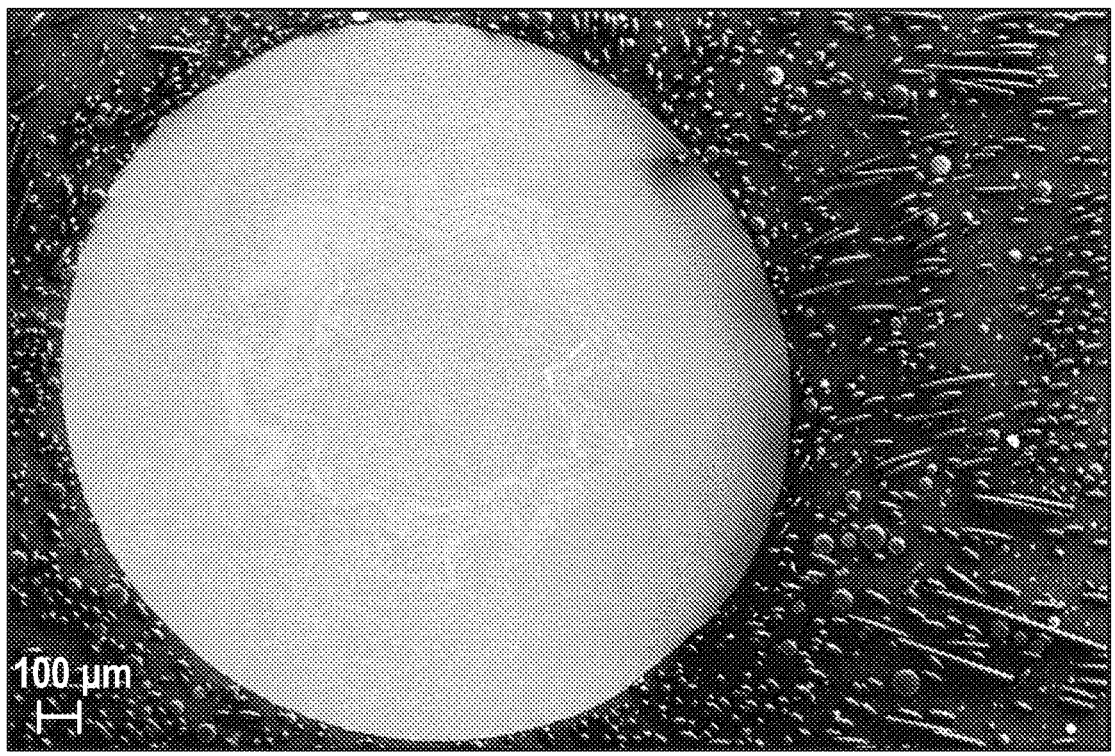
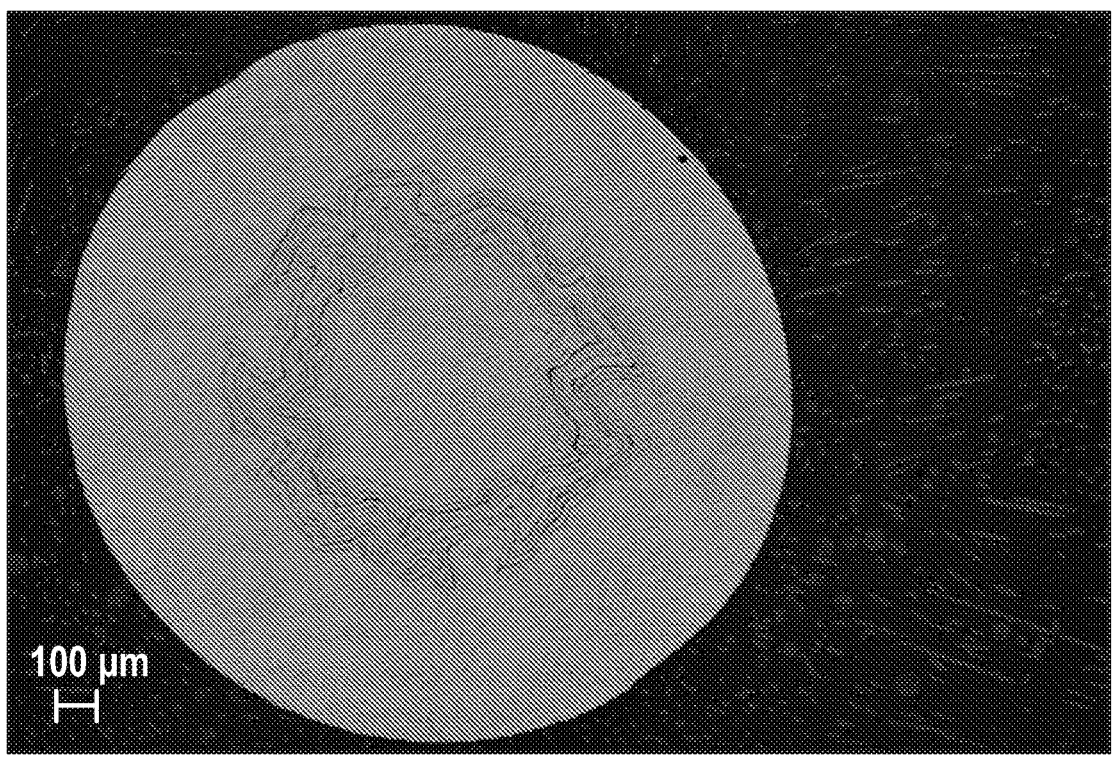

FIG. 21
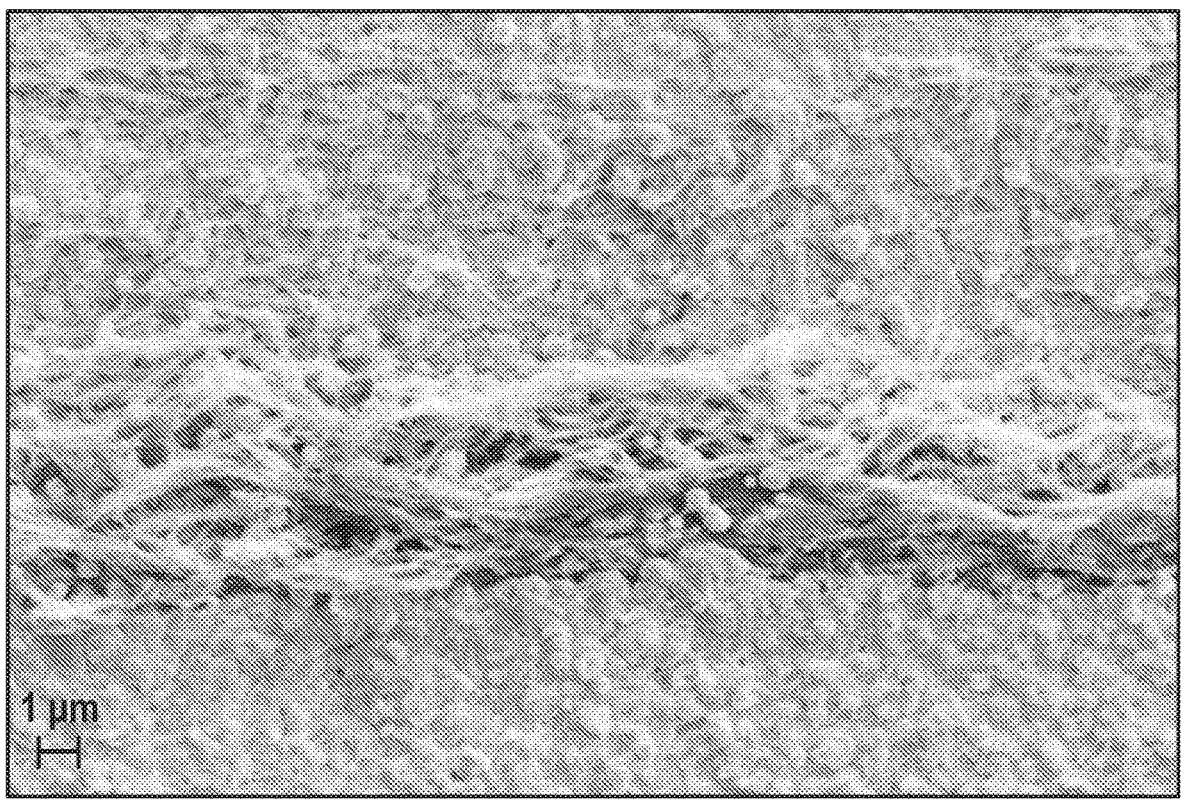
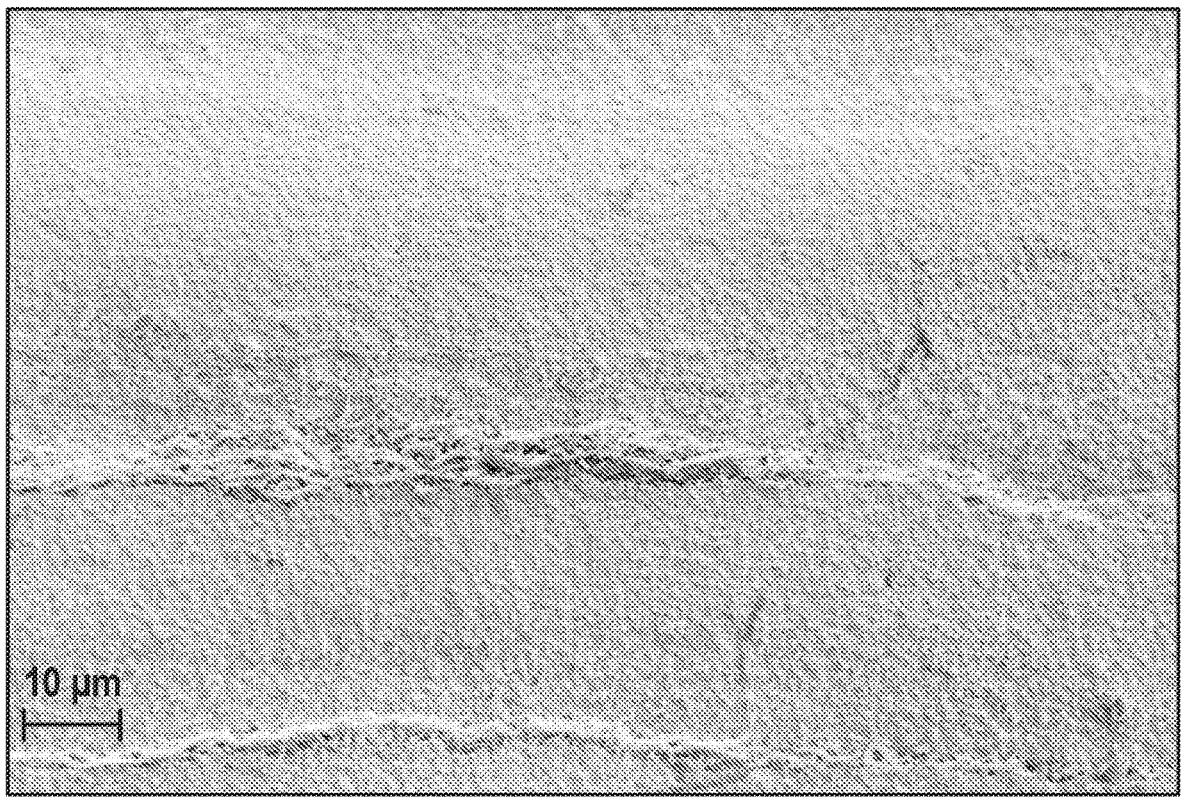

CONDUCTIVE ELEMENT

CROSS REFERENCE TO RELATED APPLICATIONS

This application is a U.S. National Phase of PCT Patent Application No. PCT/GB2019/052652 filed on Sep. 20, 2019, which claims the benefit of Great Britain Patent Application No. 1815359.3 filed on Sep. 20, 2018, the entire contents of each of these applications is incorporated herein by reference for all purposes.

The present invention relates to a method for producing a conductive element precursor, and a conductive element, particularly a wire, and a method for producing the same.

Conductive elements, and in particular wiring, are ubiquitous in our everyday lives. Conductors are present in aeroplanes, cars, spacecraft, and in power cables for carrying electricity over great distances to name just a few applications. For each of these applications it would be advantageous to increase the current carrying capacity and/or reduce the weight of these cables and/or reduce the size of the required cables. Such a reduction in weight for aerospace and car applications would significantly reduce fuel consumption and $CO_2$ production. An increase in current carrying capacity can reduce losses when transporting electricity through power cables. There is therefore a desire to create improved conductive elements and precursors that can be utilised for forming the required conductive elements. In particular, there is a desire for improved conductive elements in the form of wires.

The present invention provides a method for producing a conductive element precursor, the method comprising the following steps: forming a plurality of carbon nanotubes on a metallic substrate; applying a shear force to the plurality of carbon nanotubes on the metallic substrate in a first direction; and coating carbon nanotubes of the plurality of carbon nanotubes with a metallic material.

Further, the present invention provides a method for producing a conductive element precursor, the method comprising the following steps: growing a plurality of carbon nanotubes on a metallic substrate; applying a shear force to the plurality of carbon nanotubes on the metallic substrate in a first direction; and coating carbon nanotubes of the plurality of carbon nanotubes on the metallic substrate with a metallic material. The step of applying the shear force may occur before or after the step of coating the carbon nanotubes.

The method of the present invention provides a precursor that has carbon nanotubes that are moved in a particular direction and encapsulated. This provides a precursor that can be readily subjected to subsequent processing to form conductive elements.

The present invention further provides a method for producing a conductive tape, the method comprising the following steps: forming a plurality of carbon nanotubes on a metallic substrate; applying a shear force to the plurality of carbon nanotubes on the metallic substrate in a first direction; and compressing the metallic substrate with the plurality of carbon nanotubes such as to increase its length and form the conductive tape.

The present invention also provides a method for producing a conductive element, the method comprising the following steps: forming a plurality of carbon nanotubes on a metallic substrate; rolling up the substrate with the plurality of carbon nanotubes to form an insert; and drawing the insert to increase its length and form the conductive element.

In particular, the present invention provides a method for producing a conductive element, the method comprising the following steps: forming a plurality of carbon nanotubes on a metallic substrate; coating carbon nanotubes of the plurality of carbon nanotubes with a metallic material; rolling up the substrate with the coated carbon nanotubes to form an insert; and drawing the insert to increase its length and form the conductive element.

The method of the present invention ensures that the carbon nanotubes are in intimate contact with a metallic material so as to assist their incorporation into the conductive element. Further, coating the carbon nanotubes can provide protection to the carbon nanotubes in the subsequent processing steps. This assists in providing good quality carbon nanotubes present in the conductive element and thus provides a high-quality conductive element, where the carbon nanotubes contribute to the conduction.

The conductive element can be of any form, including that of a foil. However, following the method of the present invention, the final conductive element will be generally in an elongate form. Accordingly, the present invention is particularly suited for producing conductive elements in the form of a wire or a tape. A wire has a generally circular or square cross-sectional area, whereas a tape has a generally rectangular cross-sectional area. The most preferable form for the conductive element is that of a wire.

The conductive tape may be produced by compressing the conductive element precursor such as to increase its length and form the conductive tape. Therefore, the tape can be formed without rolling up the substrate. The compressing step changes the cross-section of the conductive element precursor. The conductive element precursor may be subjected to multiple compressing steps. The conductive element precursor may be subjected to annealing steps as described herein, between the compressing steps. The general considerations of a metal rolling process are considered in Le and Sutcliffe, International Journal of Mechanical Sciences 43 (2001), p1405-1419.

The step of compressing the conductive element precursor such as to increase its length and form the conductive tape can be utilised to simultaneously apply a shear force to the plurality of carbon nanotubes on the metallic substrate in a first direction. Alternatively, a separate step of applying the shear force can be utilised.

The metallic material comprises metal. The metallic material preferably consists essentially of metal, most preferably it consists of metal. The metallic material may be a metallic alloy.

The method involves forming a plurality of carbon nanotubes on a metallic substrate. The carbon nanotubes are grown on a first surface of the metallic substrate. In addition, the carbon nanotubes can also be grown on a second surface of the metallic substrate. This can occur simultaneously by exposing both surfaces during the process of growing the carbon nanotubes. The first and second surfaces can be opposing surfaces. When the metallic substrate is in the form of a foil, the two surfaces can be the two major surfaces of the foil. The carbon nanotubes can be formed on the surface of the metallic substrate such that the carbon nanotubes grow away from the surface. The longitudinal axis of the carbon nanotubes can be substantially aligned. The longitudinal axis of the carbon nanotubes can be substantially perpendicular to the plane of the first surface of the metallic substrate. The longitudinal axis of the carbon nanotubes can be substantially perpendicular to the plane of the second surface of the metallic substrate.

The metallic substrate may be substantially planar, for example by being in the form of a foil. During the growth of the carbon nanotubes, the substrate may be orientated so that carbon nanotubes predominantly form on the substrate's vertical surfaces. For a planar metallic substrate this can be achieved by having its two major surfaces oriented substantially vertically. The metallic substrate may be orientated so that the subsequent drawing direction, or another direction along which alignment is desired, is vertical. Without wishing to be bound by theory, it is believed that orientating the substrate in this manner allows the carbon nanotubes to grow under the influence of gravity which can introduce an initial alignment along the vertical direction.

When referring to vertical and horizontal herein, vertical is defined as the direction of gravitational force as indicated by a plumb-line. The horizontal direction is perpendicular to the vertical direction.

As used herein, the term "substantially aligned" refers to the carbon nanotubes being orientated so that the majority of carbon nanotubes have their longitudinal axis within a 45° range, preferably 25°, or preferably 20°, or 15°, or 10°, or most preferably within 5°. Substantially all, or all, of the carbon nanotubes may have their longitudinal axis within these ranges.

As used herein, the term "substantially perpendicular" or "substantially parallel" means that the majority of carbon nanotubes are orientated so that their longitudinal axis lies within 22.5° of the perpendicular direction or parallel direction, respectively, preferably within 20°, or 15°, or 10°, or most preferably within 5°. Substantially all, or all, of the carbon nanotubes may have their longitudinal axis within these ranges.

By forming the carbon nanotubes on a metallic substrate, the resulting carbon nanotubes are in an unbundled state, i.e. the majority of carbon nanotubes exist as separate carbon nanotubes. This allows their conductivity properties to be maintained when incorporated into the conductive element. This is in contrast to carbon nanotubes present in bundles, which have diminished conductivity properties. The subsequent coating of the carbon nanotubes can assist in keeping the nanotubes separated.

In the present invention, the carbon nanotubes are grown on the substrate, and the carbon nanotubes are retained on the substrate throughout the subsequent processes in order produce the conductive element precursor and the final conductive element product. This increases the ease of handling the carbon nanotubes.

The step of forming a plurality of carbon nanotubes on a metallic substrate may involve forming the plurality of carbon nanotubes directly on a metallic substrate. Alternatively, there is preferably an intervening material layer between the metallic substrate and the growing carbon nanotubes.

Any method of forming a plurality of carbon nanotubes on a metallic substrate may be used, especially those that produce aligned carbon nanotubes. Such approaches include pyrolysis of hydrocarbon gases such as acetylene, butane or methane in the presence of ferrocene or iron phthalocyanine.

A particularly preferred approach involves chemical vapour deposition. The chemical vapour deposition process utilised can be a direct liquid injection chemical vapour deposition (DLICVD) approach. In this approach, a liquid hydrocarbon precursor is injected, vaporised and then carried to a reaction chamber where the carbon nanotubes are deposited and grown on the substrate. Various types of liquid hydrocarbons can be used with this approach, for example n-pentane, isopentane, hexane, heptane, octane, cyclohexane, benzene, toluene, or xylene.

In order to initialise the growth of the carbon nanotubes a catalyst can be present. This catalyst may be present on the metallic substrate. The distribution of the catalyst on the metallic substrate can be essentially random. However, it is particularly preferred that the catalyst is included in the liquid with the hydrocarbon in a DLICVD process and is injected and introduced into the reaction chamber along with the hydrocarbon. The use of a catalyst assists in forming the plurality of carbon nanotubes on the surface of the metallic substrate so that they are in an unbundled state.

Potential catalysts for assisting the growth of the carbon nanotubes include iron, cobalt, nickel, ruthenium, palladium and platinum. Where the catalyst is to be introduced with the liquid hydrocarbon, a precursor of the catalyst metal is selected, for example metal salts and organometallic compounds. Particularly preferred compounds are ferrocene, nickelocene, cobaltocene, ruthenocene, iron phthalocyanine and nickel phthalocyanine.

When the metal catalyst precursor is combined with the liquid hydrocarbon, it can be in a concentration of 0.2 to 15% by weight. Preferably 1 to 10% by weight, or 1.5 to 7% by weight, most preferably 1.5 to 5% by weight. A particularly preferred amount is 2.5% by weight.

In the DLICVD process, the injected liquid is preferably introduced in the form of droplets. This increases the ease with which the liquid can be evaporated and carried into the reaction chamber.

The pyrolysis is carried out at a temperature between 60° and 1100° C., preferably from 700 to 1000° C. and most preferably 700 to 900° C.

The substrate may be heated up to the reaction temperature via resistive heating of the substrate itself, i.e. by passing a current through the substrate.

The pyrolysis can be carried out for any suitable amount of time in order to form the required amount of carbon nanotubes. For example, the pyrolysis may be carried out for at least 5 minutes. The pyrolysis may be carried out for at least 10 minutes, or at least 15 minutes.

The form of the droplets and the frequency with which the droplets are injected may be varied as required by the process. For example, each droplet may have a volume of between 2 to 100 μl. The droplets may be injected at a frequency of 0.9 to 1200 injections per minute, possibly a rate of 1 to 60 injections per minute, preferably between 20 and 30 injections per minute. Alternatively, the droplets may be injected at a frequency of over 2000 injections per minute, for example 3000 injections per minute. Such a high injection frequency has been found to be particularly effective.

Prior to forming the carbon nanotubes, it is preferable that the metallic substrate has a ceramic layer on it. The nanotubes can then grow on this ceramic layer. The ceramic layer can be from 20 to 500 nm in thickness, possibly 400 nm in thickness. Possible ceramics for the ceramic layer include $SiO_2$, $Al_2O_3$, $ZrO_2$, $TiO_2$, $Y_2O_3$, SiC, SiCN, SiON and SiCN. The particularly preferred ceramic is $SiO_2$.

The ceramic layer may be deposited via chemical vapour deposition before forming the plurality of carbon nanotubes. In particular, the ceramic layer may be formed by DLICVD. Any suitable ceramic precursor may be used. The ceramic precursor may be dissolved or suspended in a liquid. Possible ceramic precursors include $Si(OEt)_4$, $(iPrO)_3Al$, $(BuO)_4Zr$, $(BuO)_4Sn$, titanium titanium acetylacetonate, yttrium isopropoxide, tetramethylheptanedionate, dibutoxy diacetoxy silane or HMDS. The use of dibutoxy diacetoxy silane has been found to be particularly effective. The pyrolysis is performed at a temperature and pressure sufficient to ensure the decomposition of the precursor.

The chemical vapour deposition of the ceramic layer and the chemical vapour deposition of the nanotubes may occur in the same reactor. Alternatively, the deposition of a ceramic layer can occur in a separate reactor to the deposition of the nanotubes. This has the advantage that the first reactor is not exposed to the carbon nanotube growth and so does not require regular cleaning. Also, the reactor used for the deposition of the carbon nanotubes can be selectively closed off and cleaned by introducing a gas containing oxygen to burn off any stray and potentially harmful carbon nanotubes. Therefore, this can facilitate an ultra-clean and ultra-safe process. The temperature of the substrate may be maintained when the substrate is transferred between separate reactors. This can increase the efficiency of the overall process.

In general, the DLICVD process involves the injection of the liquid that is vaporised and subsequently carried by a carrier gas into the reaction chamber. Such carrier gases are usually an inert gas. Possible carrier gases include argon, helium, nitrogen and hydrogen or mixtures of these. The carrier gas may be supplied at a rate of between 1 and 5 SLM, preferably between 1 and 3 SLM. Although, any carrier gas rate suitable for the reactor size may be utilised.

The growth of the carbon nanotubes may be assisted by utilising the presence of $H_2O$ or $CO_2$ in the carrier gas stream, as described in Sato et al, Carbon 136 (2018), pp 143-149. The presence of $H_2O$ and $CO_2$ is particularly advantageous for the uniform growth and increased yield of carbon nanotubes. The $H_2O$ or $CO_2$ is utilised in the growth phase of the carbon nanotubes and, without wishing to be bound by theory, it is believed that these additions help prevent catalyst deactivation by removing carbon byproducts and/or suppressing Ostwald ripening of catalyst particles.

Following the step of forming the plurality of carbon nanotubes, any loose carbon nanotubes can be removed by blowing the plurality of carbon nanotubes with an inert gas, for example argon.

The metallic substrate may comprise any metal. Possible metals for forming the metallic substrate include palladium, platinum, gold, chromium, manganese, aluminium and copper. Metal alloys can be used for the metallic substrate, for example steel. A particularly preferred metallic substrate for the present invention is copper.

The method of the present invention preferably comprises a coating step. This coating step results in the carbon nanotubes being coated with a metallic material. The carbon nanotubes are preferably coated such that carbon nanotubes are individually coated with the metallic material. Each carbon nanotube of the plurality of carbon nanotubes may be coated with the metallic material. The coating step results in the carbon nanotubes being substantially encompassed by the metallic material. This ensures that the nanotubes are protected during the subsequent processing and also ensures a good interface between the carbon nanotubes and the resulting matrix of a conductive element. It can also assist in avoiding bundling of the carbon nanotubes during subsequent processing of the carbon nanotubes and so maintain their conductivity when they are present in the final conductive element.

Since the coating step results in the carbon nanotubes being partially, substantially or fully enclosed within the metallic material, the carbon nanotubes will be protected during the subsequent step of annealing that is described herein.

The possible metallic materials for the coating step can be independently chosen from the materials listed herein as possible metallic materials for the metallic substrate. The metallic material that is used for coating is preferably the same as the metallic substrate but may be different. The metallic material for the coating step is preferably copper.

The coating step can be performed by infiltrating the plurality of carbon nanotubes with an aqueous super saturated metal salt solution or an organic solution. Where an aqueous super saturated metal salt solution is utilised, the carbon nanotubes can undergo an oxygen plasma functionalization step prior to infiltration in order to make the nanotubes hydrophilic. Following infiltration the plurality of nanotubes are then dried to deposit the metal precursor. This metal precursor can then be reduced in order to convert it to the metallic material. This infiltration and drying step can be repeated several times to coat the carbon nanotubes to a desired degree.

A particularly advantageous approach for coating carbon nanotubes utilises chemical vapour deposition. Chemical vapour deposition can be used to fully coat the carbon nanotubes. Alternatively, the coating step may occur in two stages. Firstly, the carbon nanotubes can be initially decorated with the metallic material and then a second stage can be used to complete the coating with further metallic material. As used herein, the term "decorated" refers to the deposition of particles of metallic material on the surfaces of the carbon nanotubes.

The first stage of decorating the carbon nanotubes with the metallic material can occur via an initial infiltration step, such as infiltrating with an aqueous super saturated metal salt solution or an organic solution as detailed herein, or alternatively can occur via the CVD approach. By utilising the CVD approach, the carbon nanotubes can be coated without the need to treat the carbon nanotubes to make them hydrophilic or utilise an organic solvent. Any suitable metallic precursor can be used for this decoration step. The initial decorating stage primes the carbon nanotubes so that the coating can be subsequently completed by an aqueous copper plating process. The initial decorating step allows initial sites of metallic material to be formed throughout the carbon nanotubes. The CVD approach is particularly effective at achieving this. These initial regions of deposited metallic material facilitate the subsequent uniform coating of the carbon nanotubes. Further, by performing an initial decorating step, the carbon nanotubes can be maintained in an unbundled state when undergoing a processing step, such as the application of a shear force described herein, before the final stage of coating.

The electrical properties of the carbon nanotubes may be improved by the inclusion of a doping step whereby the carbon nanotubes are decorated using a CVD approach with molecules of a halogen such as iodine. This step can be carried out before, or after, or intermediate or concurrent with, the step of decorating the carbon nanotubes with a metallic material. A suitable solution for use in doping iodine via CVD is a solution of iodoethane ($C_2H_5I$) in toluene, particularly two parts of iodoethane for one part of toluene. An alternative solution for use with CVD is 12 crystals in solution in toluene.

It is particularly advantageous to utilise CVD for the step of depositing the ceramic interlayer (possibly in a first reactor), the step of depositing the carbon nanotubes (possibly in a second reactor), and decorating the carbon nanotubes (possibly in a third reactor). Utilising CVD for each of these steps should increase efficiency of the overall process. Also, utilising separate reactors (chambers) for each step assists in maintaining the ultra-clean and ultra-safe process, where each reactor can be selectively isolated from the others.

Following a decorating stage, the coating can be finished by using an electroplating step. In this way, the metallic material is electroplated onto the nanotubes. This approach ensures a good coverage of the carbon nanotubes by the coating step.

In the electroplating step, the metallic substrate with the carbon nanotubes thereon is the cathode of the electrolytic cell, while the anode may be an electrolytic grade metallic coating material in an anode bag. The metallic substrate can be electrically connected to the current supply via a conductive clamp. Multiple conductive clamps can be connected at opposing extremities of the metallic substrate. The cell can be set up with the anode bag extending geometrically parallel to the metallic substrate in order to assist in providing a homogenous coating. The electroplating bath may comprise $CuSO_4$. The electroplating bath may additionally comprise sulphuric acid, sodium chloride, N-methyl pyrrolidone, methanol, ethanol, acetonitrile, cetyl trimethyl ammonium bromide, octylphenoxypolyethoxyethanol, and/ or sodium dodecyl sulphate. The electroplating bath comprising a combination of a cationic and a non-ionic surfactant, such as cetyl trimethyl ammonium bromide and octylphenoxypolyethoxyethanol, has been found to be particularly effective.

The electroplating bath may have a concentration of between 10 and 100% relative to the maximum concentration. In particular, the concentration may be between 30% and 60% relative to the maximum concentration, for example 40%.

The electroplating bath may be maintained at a temperature of between $-20°$ C. and $50°$ C. during the electroplating process. In particular, the temperature may be between $-10°$ C. and $10°$ C., for example $-5°$ C.

The electroplating bath may be agitated during the electroplating process. Suitable methods of agitation include sparging, stirring (for example by using a magnetic stirrer), and ultrasonic agitation.

Electroplating may be carried our using a pulsed plating frequency of 0.1 Hz to 100 kHz, for example 500 Hz.

Electroplating may be used to fully coat the carbon nanotubes. In other words, electroplating can be used without the initial decoration step described herein.

The present invention comprises a rolling step. In this step, the substrate with the coated carbon nanotubes is wound about itself. In other words, the substrate with the coated carbon nanotubes formed on it is rolled up, in an analogous way to rolling up a carpet. Therefore, it can be said that this step involves rolling up the substrate with the coated carbon nanotubes to form an insert. In other words, it is in such a form as to assist its insertion in the further processing steps.

The rolling step is preferably carried out so that at least a portion of the coated carbon nanotubes formed on one surface of the metallic substrate contact another surface of the metallic substrate. When carbon nanotubes have been grown on opposing surfaces of the substrate, at least a portion of the coated carbon nanotubes formed on one surface of the metallic substrate can contact coated carbon nanotubes formed on another surface of the metallic substrate. In this manner, the rolling step results in the sandwiching of at least a portion of the coated carbon nanotubes between layers of the metallic substrate. This has the benefit of surrounding the carbon nanotubes with further metallic substrate which aids the incorporation of the carbon nanotubes into the final conductive element in the subsequent steps.

In order to aid the rolling step, the metallic substrate is preferably in the form of a sheet. In other words, the substrate has a relatively small thickness dimension compared to a relatively large width and length dimension. The sheet may be particularly thin and thus be termed a foil. Such a foil may have a thickness of less than 1 mm, or less than 0.5 mm, preferably less than 0.2 mm and most preferably 0.1 mm or less. A metallic substrate having a thickness of between 10 μm and 50 μm has been found to be particularly effective.

The possible width and length dimensions of the metallic substrate are not particularly limited. The length dimension may be at least twice the width dimension, alternatively at least three times the width dimension, or at least four times the width dimension. The width dimension may be at least 50 mm and the length dimension at least 100 mm, alternatively the width dimension may be at least 100 mm and the length dimension may be at least 300 mm.

The metallic substrate may be dimensioned such that the rolling up step results in the substrate being rolled around itself at least twice. In other words, the substrate is rolled up such that it is rolled through 720°, preferably it is rolled at least 3 times, or 4 times, or 5 times, or 6 times. Even more preferably, the substrate is rolled up such that it is rolled at least 10 times, 15 times, 20 times, 25 times, 35 times, 45 times, or 50 times. The substrate may be rolled up such that it is rolled up to 50 times. By increasing the amount of times that the substrate is rolled about itself, the number of layers of carbon nanotubes sandwiched between the substrate increases. This provides more carbon nanotube material through which conduction can occur in the final product.

The rolling step preferably comprises rolling the substrate with the coated carbon nanotubes around a metallic bobbin. Utilising a bobbin facilitates the rolling step. Preferably the metallic substrate is in contact with the metallic bobbin when rolling the substrate around the bobbin. The bobbin is preferably a solid piece of material. In particular, the bobbin is preferably the same material as the substrate. In this way, the metallic bobbin contributes along with the substrate to the metallic matrix in the final product. Even more preferably, the metallic bobbin, the metallic substrate, and the metallic material used in the coating step are all the same material and they all contribute to the metallic matrix in the final product. In line with the statements regarding the metallic substrate, the metallic bobbin may comprise any of the metals highlighted for the metallic substrate. The metallic bobbin preferably comprises copper.

The dimensions of the metallic bobbin are not particularly limited. Any dimensions suitable for subsequent processing can be used. The metallic bobbin may be at least 10 mm in diameter at its greatest point, alternatively, at least 20 mm in diameter, 50 mm in diameter, 100 mm in diameter, 200 mm in diameter, or 300 mm in diameter. The increase in diameter increases the amount of substrate that can be rolled on to the bobbin.

It is preferred that the metallic substrate with the coated carbon nanotubes is affixed to the conductive bobbin prior to the rolling step. This facilitates the rolling step.

The metallic substrate may be affixed to the conductive bobbin by welding, soldering, brazing or mechanical means. In relation to welding, any suitable form of welding may be used, such as friction stir welding.

The metallic substrate may be affixed to the metallic bobbin along one edge of the metallic substrate. This provides one fixed edge relative to the bobbin that is retained in place, while the opposite free end is rolled about the metallic bobbin in order to roll the substrate around the metallic bobbin. The metallic bobbin may contain a slot configured to receive an end of the metallic substrate to retain the metallic substrate along the one edge.

The metallic bobbin with the metallic substrate rolled around it can be placed in a metallic sleeve in order to form the insert. The metallic bobbin can be shaped such that it comprises a recess into which the metallic substrate will be rolled up. The metallic substrate and the bobbin are sized such that when the metallic substrate is fully rolled onto the bobbin it fills the recess so as to be flush with the outer surface of the bobbin. This ensures that the bobbin with the metallic substrate thereon can be slid into a sleeve and allows for a tight fit in the sleeve. Alternatively, the metallic substrate and the bobbin are sized such that when the metallic substrate is fully rolled onto the bobbin it fills the recess so as to sit just proud of the rest of the bobbin. This can ensure that the rest of the bobbin does not interfere with the initial compaction of the metallic substrate during the subsequent drawing step and promotes the production of a quality interface during the subsequent processing of the insert.

The sleeve and the bobbin can be any suitable length such that bobbin can be received within the sleeve. The sleeve may be up to 1 metre long. The bobbin may be up to 400 mm long. The final conductive element can be scanned and cut appropriately to remove any part which does not contain the required carbon nanotubes. This may be caused by the greater length of the sleeve relative to the bobbin before the drawing step.

The metallic sleeve may comprise any of the metals listed herein in relation to the metallic substrate. It is preferable that the metallic sleeve is the same material as the metallic bobbin. In particular, the metallic sleeve preferably comprises copper. The metallic sleeve contributes to the matrix of the final product. Thus, it is particularly preferred that the metallic sleeve, metallic bobbin, metallic material and the metallic substrate are all the same material, which comprises copper. In aspects of the present invention where not all of the metallic sleeve, metallic bobbin, metallic material and the metallic substrate are present, those that are present are preferably all the same material, which is preferably copper.

The method of the present invention may further comprise the step of applying a shear force to the plurality of carbon nanotubes on the metallic substrate in a first direction prior to the rolling step. This has the effect of moving, and preferably aligning, the plurality of carbon nanotubes towards a first direction. This allows the alignment to be chosen relative to the desired final structure of the product. The step of applying a shear force to the plurality of carbon nanotubes on the metallic substrate in a first direction may occur after the rolling step. The step of applying a shear force to the plurality of carbon nanotubes may refer to the shear force applied during the application of a drawing step or may be a step of applying the shear force separate to a drawing step.

This step of applying the shear force may be carried out before the coating step. In this manner, the carbon nanotubes are reoriented when they are relatively easy to move, in contrast to moving them after they have been coated. The step of applying the shear force may be carried out during the coating step. For example, the carbon nanotubes may be decorated as described herein as an initial step in the coating process, the shear force can then be applied before a later coating step is conducted to complete the coating step. This can assist in keeping the nanotubes in an unbundled state during the step of applying the shear force. The step of applying the shear force may be carried out after the coating step.

The shear force can be applied via the use of a tool, for example a tool with a flat edge. The tool may be moved along the surface of the metallic substrate on which the carbon nanotubes are formed, while the tool is kept in contact directly or indirectly with the carbon nanotubes. This results in a shear force on the carbon nanotubes. The shear force applied to the free ends of the carbon nanotubes causes the carbon nanotubes to move towards the first direction. The amount of force applied can be tailored to ensure that the carbon nanotubes do not flake off the substrate while a sufficient force is applied in order to reorient the carbon nanotubes. The shear force could also be applied with a cylindrical tool (i.e. a roller) that is rolled along the surface of the metallic substrate on which the carbon nanotubes are formed. In particular, the shear force can be applied by moving the metallic substrate with the carbon nanotubes between a pair of rollers. This is a particularly effective approach when there are carbon nanotubes present on two sides of the substrate.

It is particularly preferred that the first direction in which the shear force is applied is along the surface on which the carbon nanotubes are formed. This has the effect of laying down the carbon nanotubes so that they become more aligned with the surface of the substrate, rather than being perpendicular to the substrate.

It is particularly preferred that this first direction is substantially parallel to the rotational axis about which the metallic substrate is rolled up in the rolling step. When a bobbin is utilised, this is the rotational axis of the bobbin. In this manner, it can be ensured that all of the carbon nanotubes have been substantially aligned in roughly the same direction so they should all point approximately along the rotational axis, e.g. the length of the bobbin.

When forming a conductive tape, it is particularly preferred that the first direction is substantially parallel to the longitudinal direction in the final conductive tape.

The drawing direction is the direction along which the insert is drawn in the drawing step. The first direction may be substantially parallel to the drawing direction of the drawing step. The carbon nanotubes may be substantially aligned along the drawing direction of the drawing step. This can be achieved by inserting the bobbin into a sleeve such that the rotational axis, and the carbon nanotubes are oriented along the longitudinal direction of the insert, i.e. its elongate axis. Accordingly, the insert can then be drawn along this elongate axis during the drawing step. During the drawing step the insert's length is increased and its cross-sectional area is reduced.

It is desired to have the carbon nanotubes substantially aligned along the drawing direction since this starts the carbon nanotubes having an orientation along the elongate axis of the final product. This is a preferred orientation for conduction to occur. Regardless, the drawing step itself can cause the carbon nanotubes to align themselves to some degree along the drawing direction due to the flow of the matrix material compared to the relatively stiff carbon nanotubes. In this way, the step of applying a shear force in a first direction to the carbon nanotubes on the metallic substrate can occur as part of the drawing step where the shear force associated with the drawing step occurs in the drawing direction. Without wishing to be bound by theory, it is believed that the drawing approach can also lead to relative movement between the walls of a multi-walled carbon nanotube. This can lead to telescoping of the nanotubes improving alignment. Accordingly, the present method can lead to close alignment, or super alignment, of the carbon nanotubes in the final conductive element.

Following the drawing step there can be an annealing step. The annealing step holds the drawn product at an elevated temperature in order to remove or reduce hardening or internal stresses that may have been introduced during the drawing stage. Annealing can also be used to grow the grain size of the metallic components. This reduces the presence of grain boundaries and improves conductivity properties. The annealing temperature may be any suitable temperature, for example a temperature between 400° C. and 700° C., or between 550° C. and 800° C. Annealing can be carried out at approximately 700° C. The annealing step preferably occurs in a low oxygen, or substantially oxygen free environment. For example, the annealing may occur in an argon or nitrogen environment. When the metallic substrate is formed from copper, the annealing temperature may be in the range of 400° C. and 700° C., an most preferably the annealing temperature is 550° C.

It is possible that the drawing and annealing steps can be repeated several times so as to gradually reduce down the diameter of the drawn product and increase its length, i.e. drawing followed by annealing, followed by further drawing and then further annealing etc., This is a standard approach for producing an elongated conductor such as a wire. The drawing step can be conducted so as to reduce the diameter of the wire by between 5% and 75% between annealing steps. It is particularly preferred that the conductive element is in the form of a wire in the present invention. A wire is a conductive element that is usually a cylindrical and flexible strand of metal.

In relation to the drawing step, the insert can be drawn through a selection of ever decreasing die sizes. By pulling the insert through a die, its diameter is reduced and its length is increased. The drawn product can be annealed after several drawing applications or after each drawing application. The drawing step may comprise pulling the insert over 10 times, or over 15 times, or over 20 times through ever decreasing dies. The dies may be made from high speed steel, hardened steel or tungsten carbide.

As an initial stage of the drawing step, the insert can be subjected to a compression step (e.g. by rotary swaging or rolling) so as to deform the insert into a smaller diameter. This can assist in compacting the separate regions of the insert together. This in turn can help avoid the formation of voids during the rest of the drawing step as the length of the insert increases. The compression step can remove or substantially reduce any voids between the sleeve and the bobbin and the rolled-up foil and between the layers in the foil. This step results in a reduction of the diameter, and an increase in the length, of the of the insert, and improves the efficiency of the drawing step The plurality of carbon nanotubes utilised in the present invention preferably comprises multi-walled carbon nanotubes. These carbon nanotubes are constituted of multiple carbon nanotubes nested within each other. This form of nanotube is particularly effective at contributing to the electrical conductivity of the resulting product.

The present invention also relates to a conductive element precursor, an insert and a conductive element formed by the methods described herein.

The conductive element described herein may be insulated with an insulating sleeve. The insulating sleeve can be any suitable insulating material, such as silicone rubber, polyvinyl chloride, or PTFE.

The present invention further provides a conductive element precursor comprising a matrix, wherein the matrix comprises a metallic material; and a plurality of carbon nanotubes within the matrix, wherein the plurality of carbon nanotubes are substantially aligned.

The plurality of carbon nanotubes may be substantially aligned parallel to the outer surface. This increases the ease with which the precursor can be processed into a conductive element.

The present invention further provides an insert comprising a matrix, wherein the matrix comprises a metallic material; and a plurality of carbon nanotubes within the matrix, wherein the plurality of carbon nanotubes are substantially aligned along a longitudinal axis of the insert.

The present invention also provides an elongate conductive element comprising a matrix, wherein the matrix comprises a metallic material; and a plurality of carbon nanotubes within the matrix, wherein the plurality of carbon nanotubes are substantially aligned along a longitudinal axis of the elongate conductive element.

The matrix of the conductive element and the conductive element precursor refers to a substantially continuous region. The matrix encompasses the plurality of carbon nanotubes.

The elongate conductive element's longitudinal axis is along the elongate direction. For example, when the elongate element is in the form of a wire, the longitudinal axis runs along the length of the wire.

The conductive element and the insert may have a plurality of distinct carbon nanotube layers along a cross-section of the matrix due to the manner in which they were made. For example, the rolling step means that along the cross-section of the matrix, perpendicular to the longitudinal axis, there are layers containing the carbon nanotubes, separated by regions that are free of carbon nanotubes. These carbon nanotube layers are distinct from the rest of the matrix and can be identified by microscopy or x-ray diffraction.

The features described in relation to the method herein are also applicable to the final elongate conductive element. For example, the matrix of conductive material can be a metallic material and may be copper. Further where it is stated that nanotubes are substantially aligned, the tolerance given above applies equally to the product.

Overall, a particularly preferred approach of the present invention utilises a metallic substrate with a ceramic layer, upon which the carbon nanotubes are grown. These carbon nanotubes are retained on the substrate and an initial decorating step is performed using CVD to deposit a metallic material throughout the carbon nanotubes, and optionally a doping step using CVD to deposit halogen particles throughout the carbon nanotubes. The carbon nanotubes are then subjected to a shear force at their free ends to align them substantially along the surface of the metallic substrate. The coating of the carbon nanotubes is completed by using an electroplating approach to ensure that the carbon nanotubes are fully encapsulated. This results in a conductive element precursor.

The present invention will now be described in relation to the following specific example along with the drawings.

Figure 7:
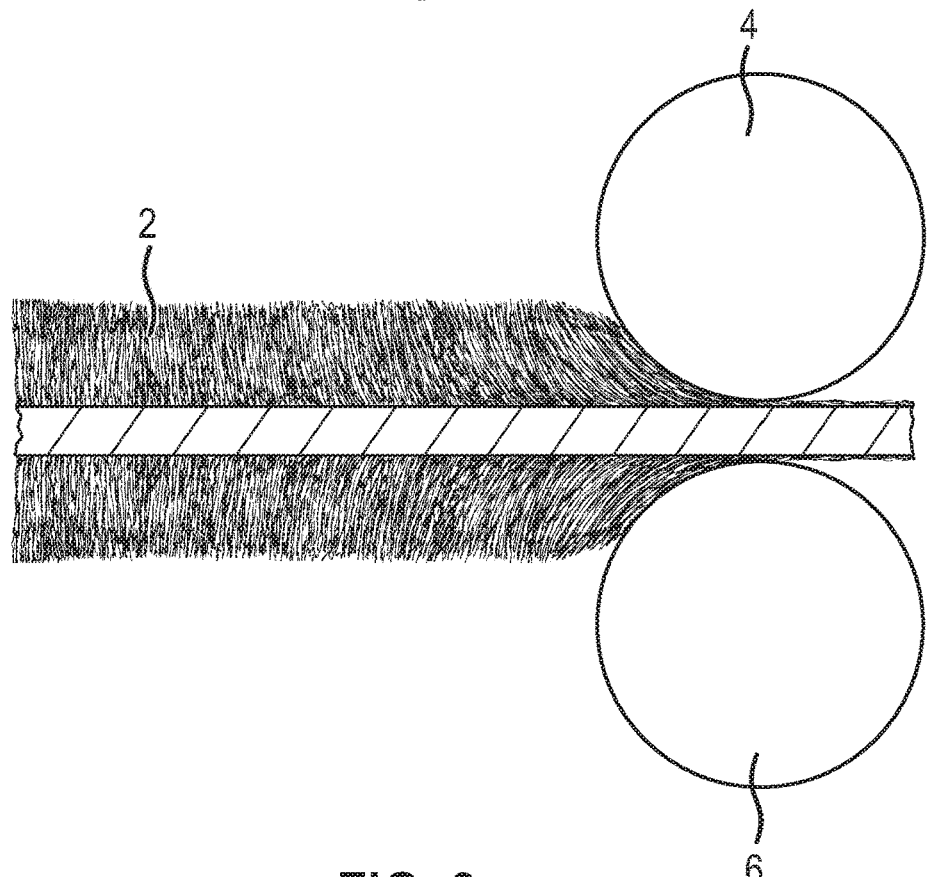

FIG. 7 schematically depicts the step of applying a shear force to the grown carbon nanotubes.

Figure 8:
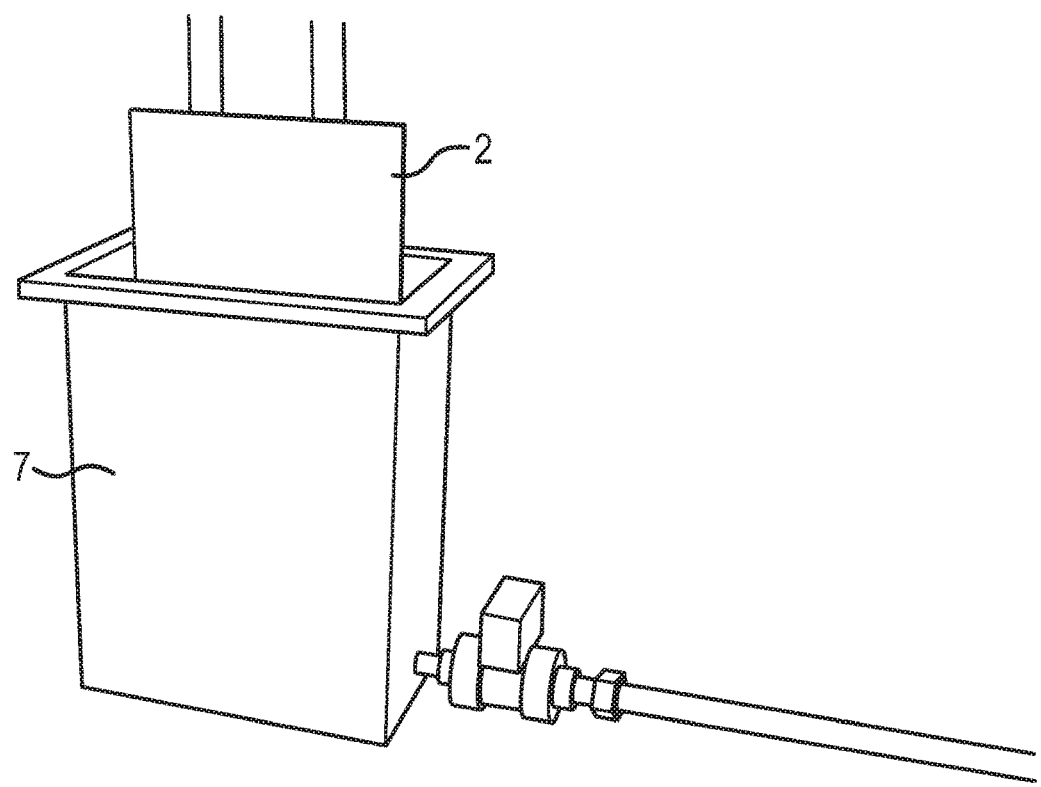

FIG. 8 is a schematic depiction of the electroplating process.

Figure 9:
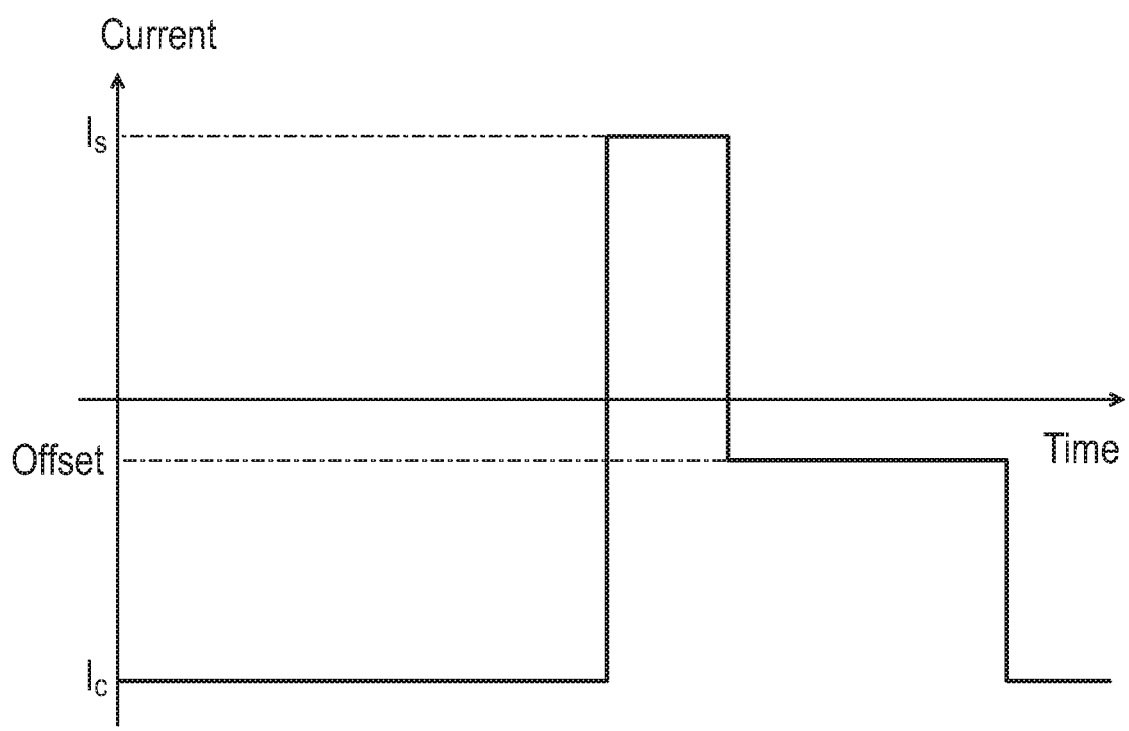

FIG. 9 is a schematic depiction of the current profile applied for the electroplating step.

Figure 10:
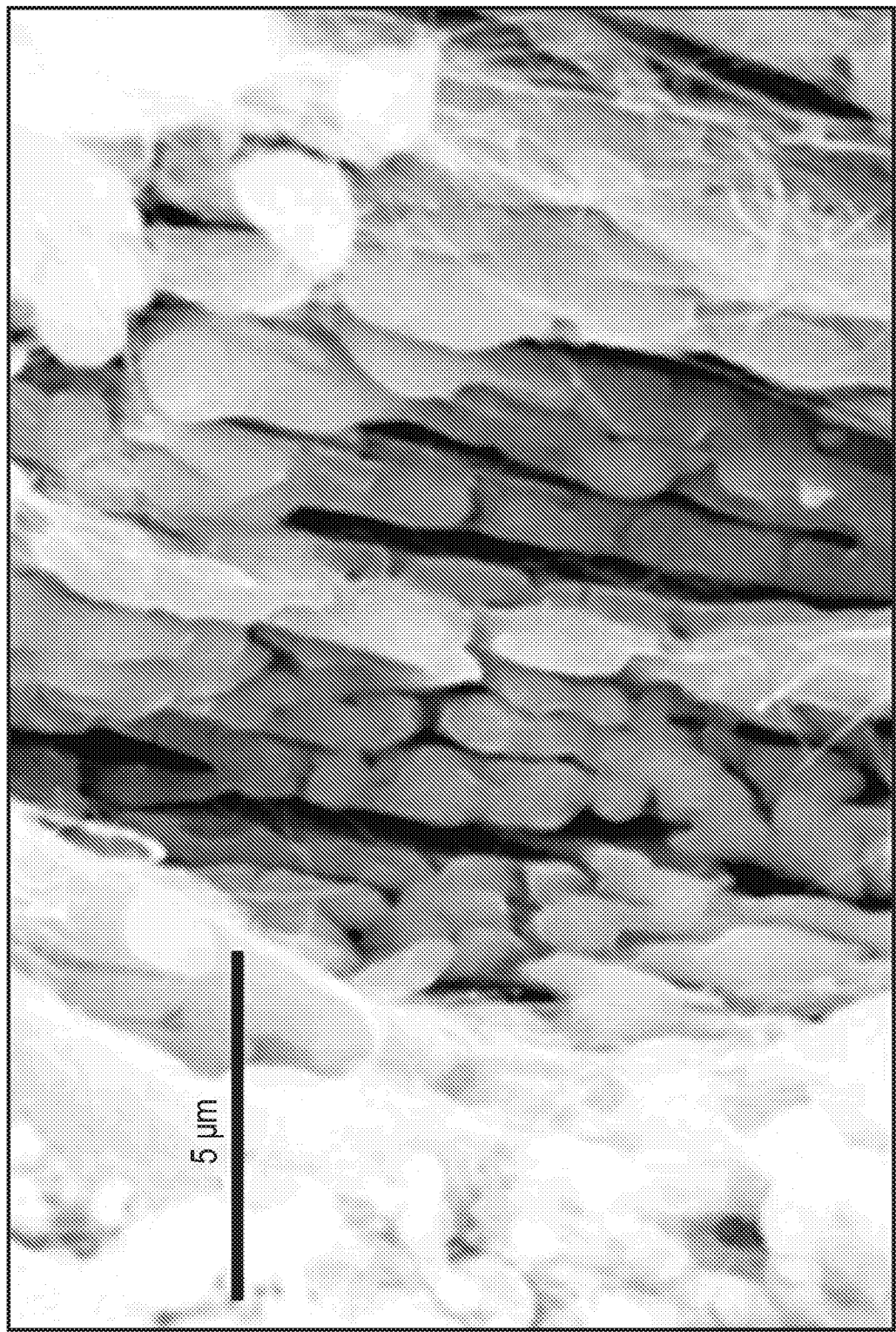

FIG. 10 is an SEM image of carbon nanotubes coated with copper following electroplating.

Figure 11:
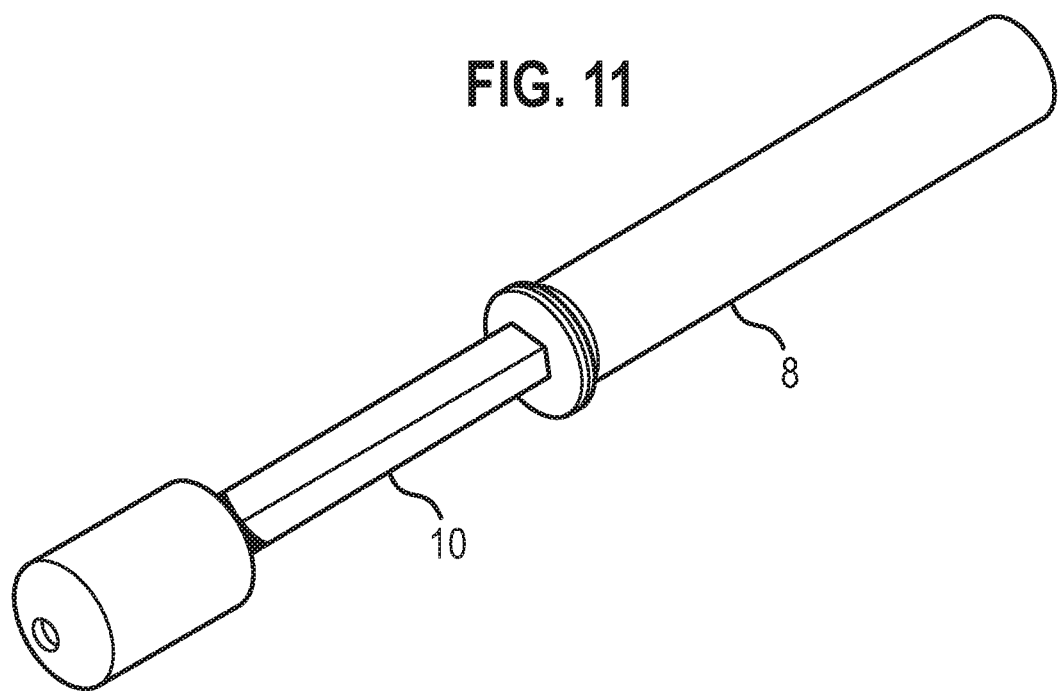

FIG. 11 schematically depicts a bobbin that can be used with the present invention.

FIGS. 12 and 13 schematically depict the metallic substrate being wound onto a recess in the bobbin.

FIG. 14 schematically depicts a sleeve that can be used with the present invention.

FIG. 15 schematically depicts a cross-section of the sleeve containing the bobbin.

Figure 16:
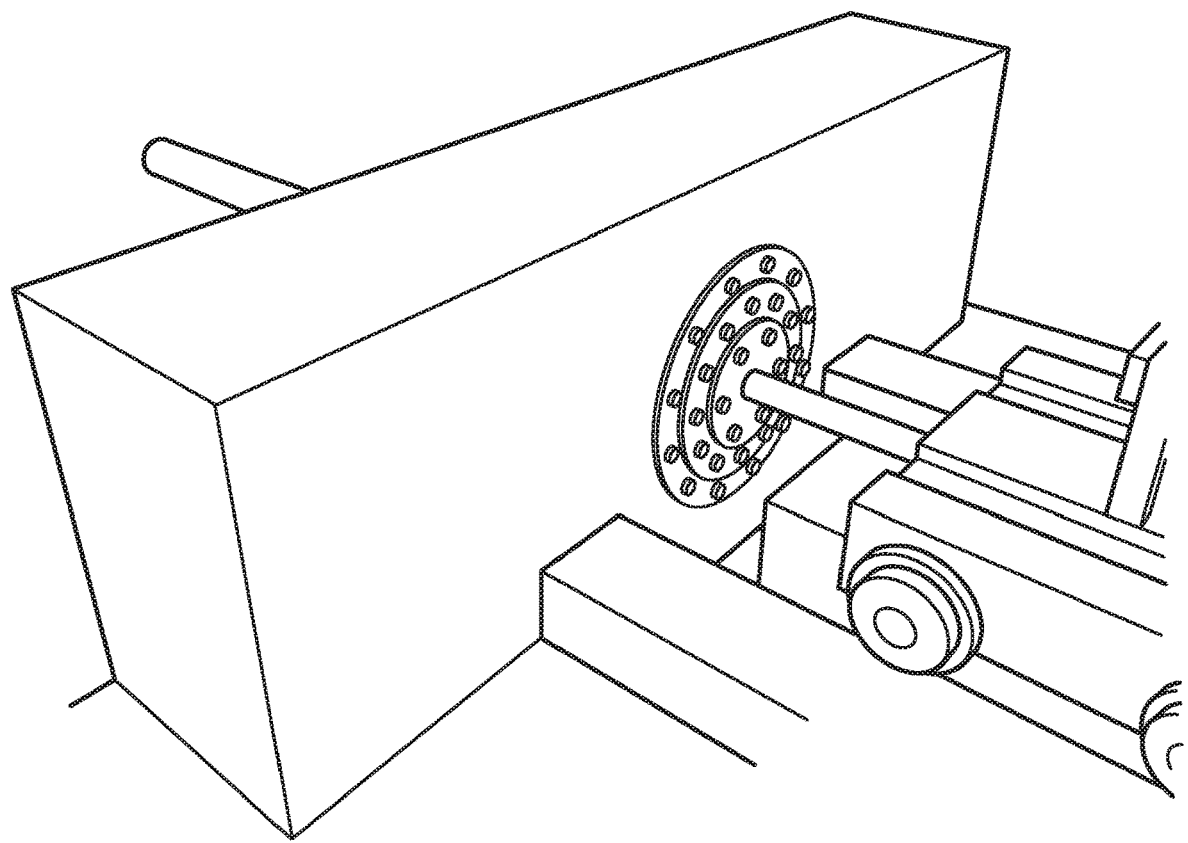

FIG. 16 schematically depicts the wire-drawing step.

Figure 17:
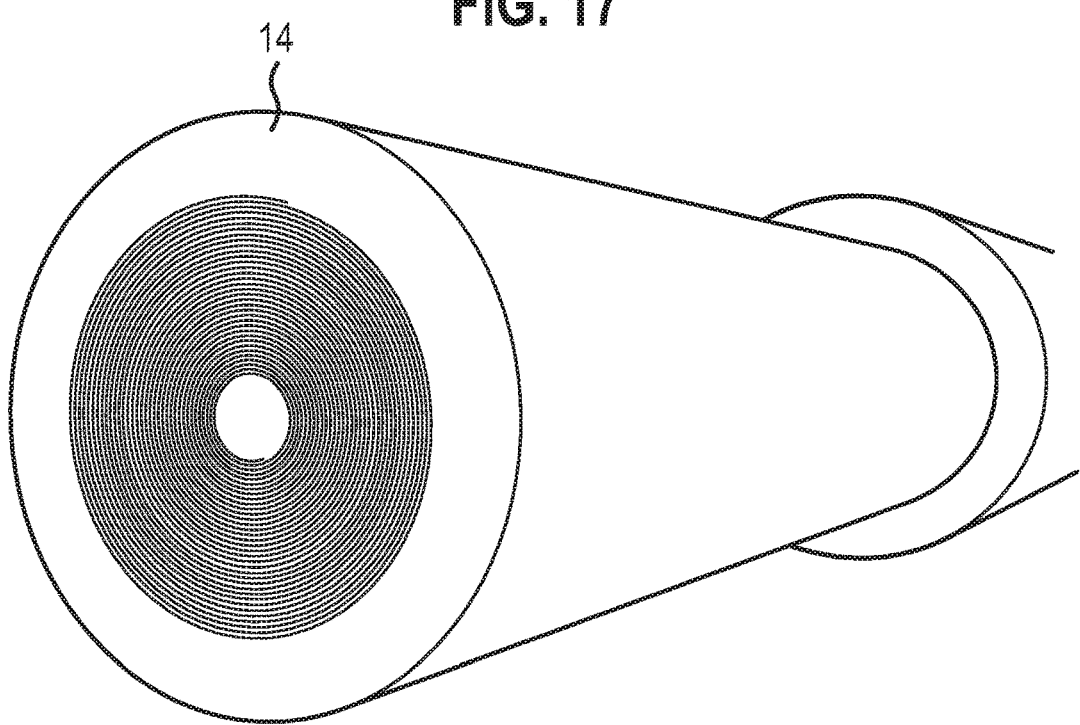

FIG. 17 schematically depicts a cross-section through the final wire.

FIG. 18 is a secondary SEM image and a backscattered SEM image of a cross-section of drawn wire.

Figure 19:
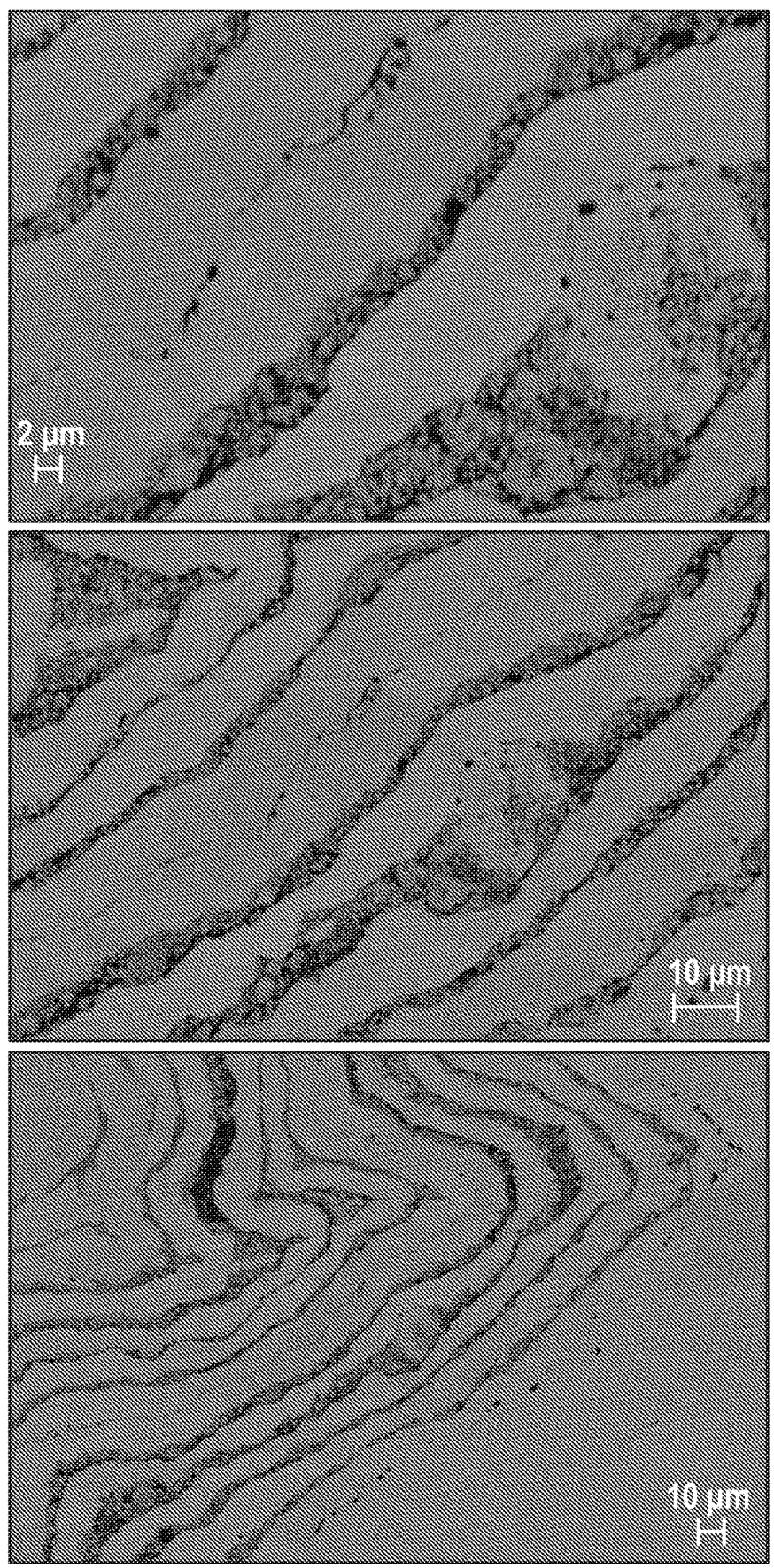

FIG. 19 is a detail of the carbon nanotube layers in FIG. 18.

Figure 20:
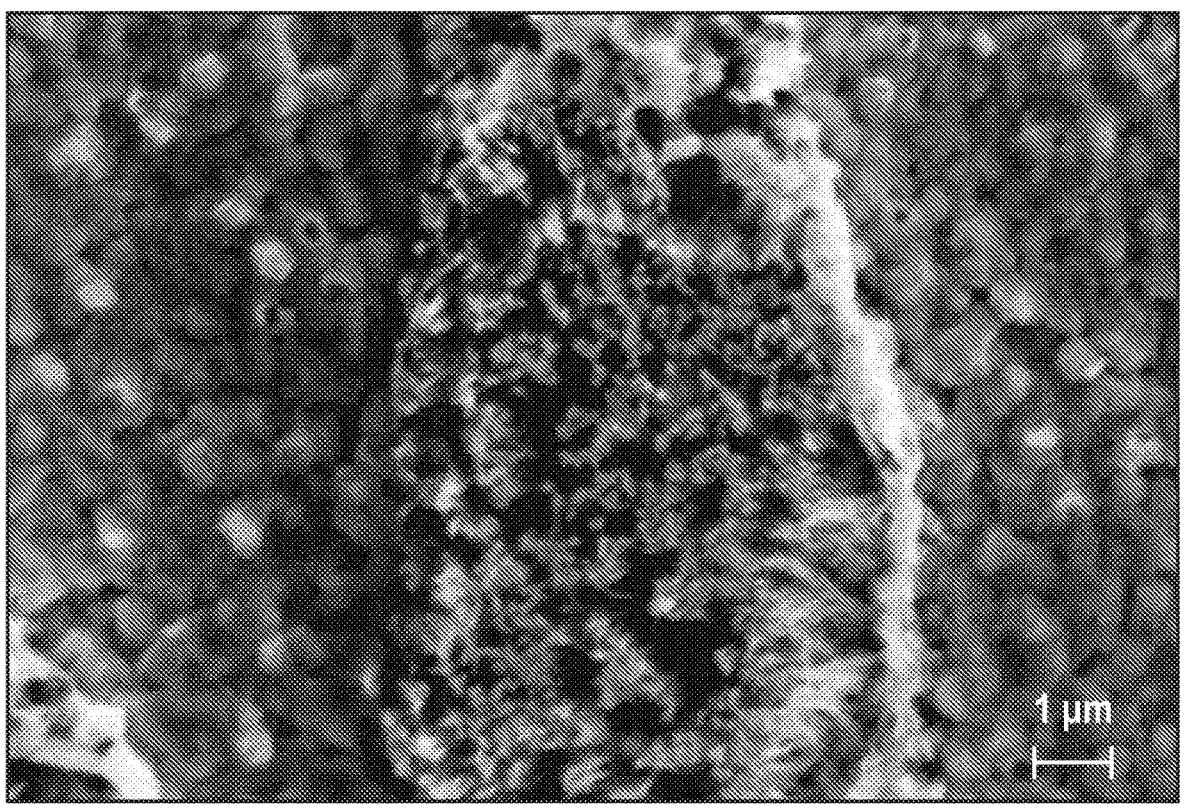

FIG. 20 is a SEM image of an etched cross-section of the drawn wire.

FIG. 21 is an SEM image of an etched longitudinal section of the drawn wire.

The substrate used is a thin copper foil ribbon that is clamped into a copper, or brass, sample holder. The term "ribbon" is used due to the copper foil's long length relative to its width. The sample holder is introduced in a first reactor chamber through a side door, where it sits on the rails that will ensure its translation to the next chamber. The deposition chamber is closed and evacuated and backfilled with argon several times to remove most of the oxygen and moisture. The pressure is then set to a value of about 5 mbar with a steady argon flow of 1 SLM.

Silica Deposition:

An electric current is run in between the two rails, through the sample holder and the copper foil ribbon. When the ribbon temperature reaches 650° C., the precursor injection can take place. The injection frequency is 50 Hz, with an opening time of 0.7 ms. A solution of 0.1 M TEOS in anhydrous toluene is injected in the evaporating vessel, which is heated at 190° C. A 2 SLM Ar carrier gas flow is run through the evaporator. After 15 minutes of injection, the flow of precursor is interrupted, and the chamber evacuated several times to remove the remaining traces of precursor solution.

Figure 1:
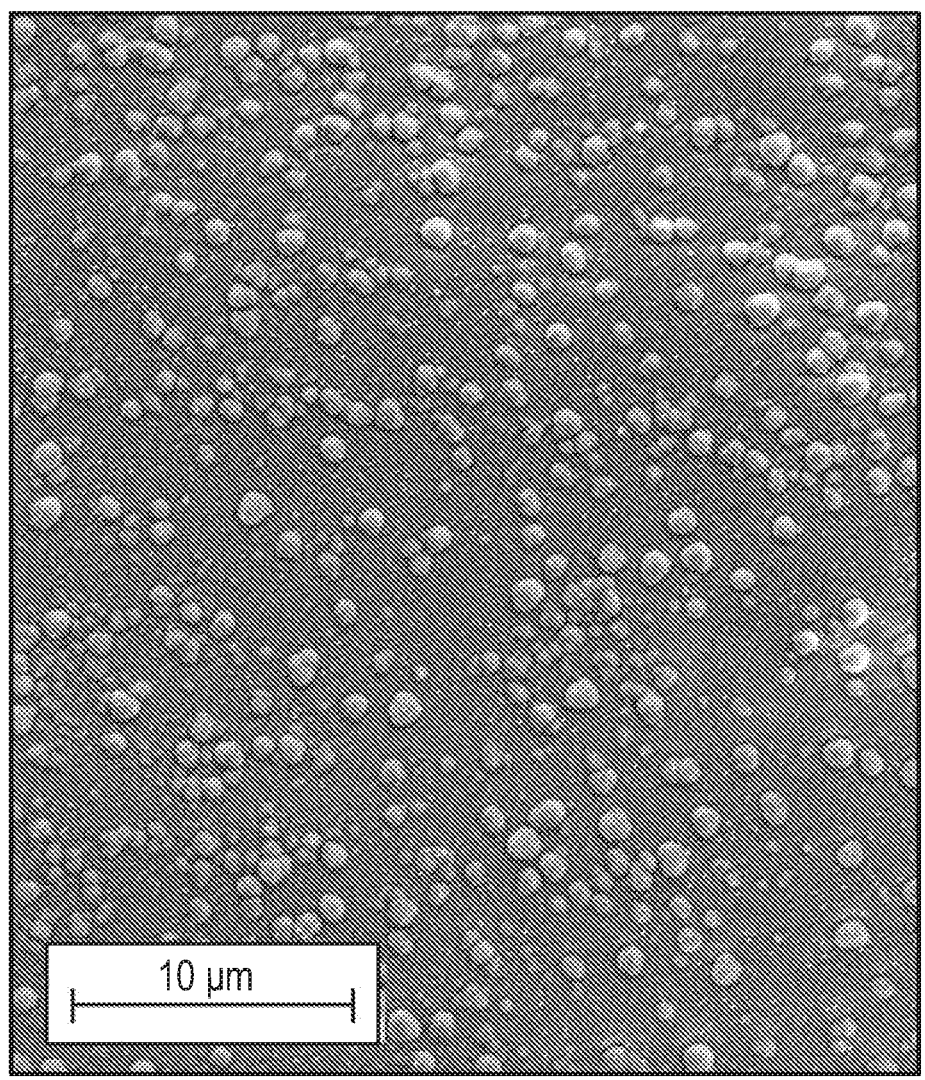
FIG. 1 is an SEM image of the surface of the deposited silica layer on a copper foil.
Figure 2:
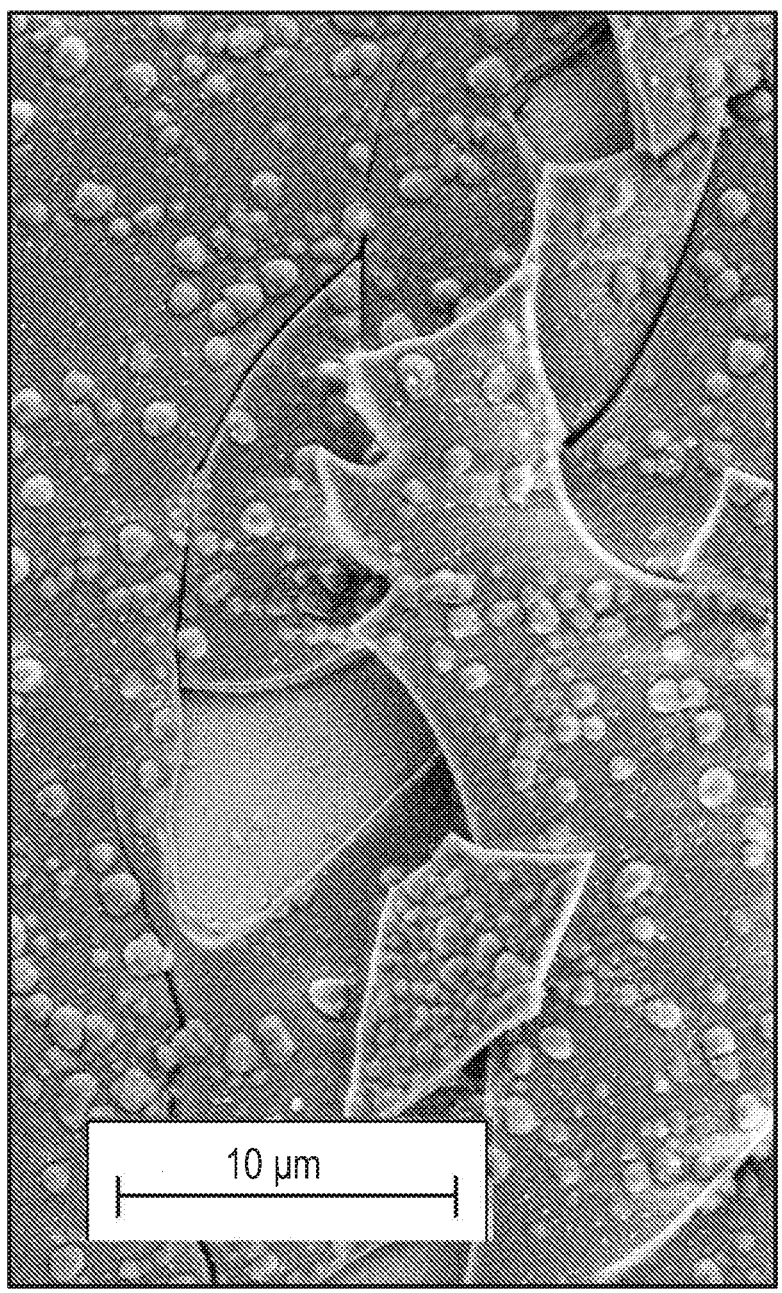
FIG. 2 is an SEM image of the surface of the deposited silica layer on a copper foil where the silica layer has been cracked.

The obtained silica layers are 400 nm thick on average, and very smooth, as the SEM micrograph of FIG. 1 shows. FIG. 2 demonstrates a section where the silica layer has been deliberately cracked to expose the underlying copper foil for illustration purposes. In practice, to avoid cracking, the elevated temperature of the metallic substrate can be maintained between the deposition of the silica layer and the next carbon nanotube forest growth step.

Carbon Nanotube Forest Growth:

Once the cleaning is finished, the pressure in the chamber is raised by filling with argon gas and once atmospheric pressure is reached, the sample holder is transferred to the next chamber through a gate valve. Once the sample is in the second chamber and the gate valve locked, the carbon nanotube injection process can begin. The precursor of a 3% wt solution of ferrocene in toluene, injected along the same process as the silica precursor. The injection parameters are 0.7 ms opening time, 25 Hz frequency and 3 SLM Ar carrier gas flow. The pre-heating furnace taking place in between the evaporator and the deposition chamber is heated at 725° C. The process lasts for 10 minutes. Once the process is finished, the copper ribbon is cooled down, and the chamber is evacuated and filled back with argon to remove the traces of precursor remaining.

Figure 3:
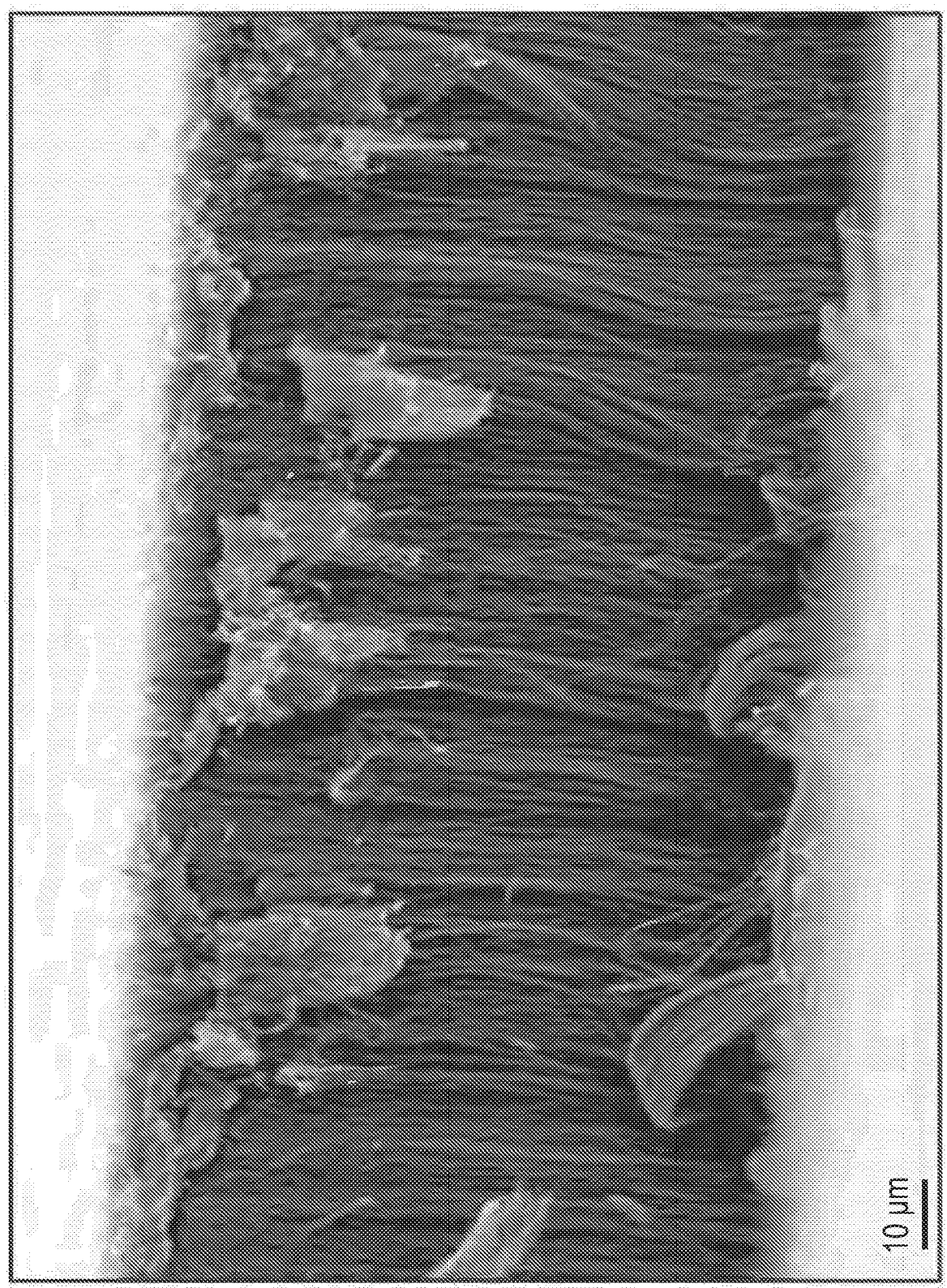
FIG. 3 is an SEM image of the carbon nanotubes grown on a copper foil.

The carbon nanotube forests grown by this process have about 400 μm thickness, with a carbon nanotube density of about $10^8$ carbon nanotubes per $cm^2$ and very good alignment as shown in FIG. 3.

Loose Carbon Nanotube Cleaning:

Once the carbon nanotube forest growth process is finished, the sample holder is transferred to an intermediate cleaning chamber through another gate valve. There, it is submitted to a high argon flow to blow away any loose CNT. Once this step completed, it is transferred to the third deposition chamber.

Figure 4:
FIG. 4 is an SEM image of carbon nanotubes with deposited copper particles.
Figure 5:
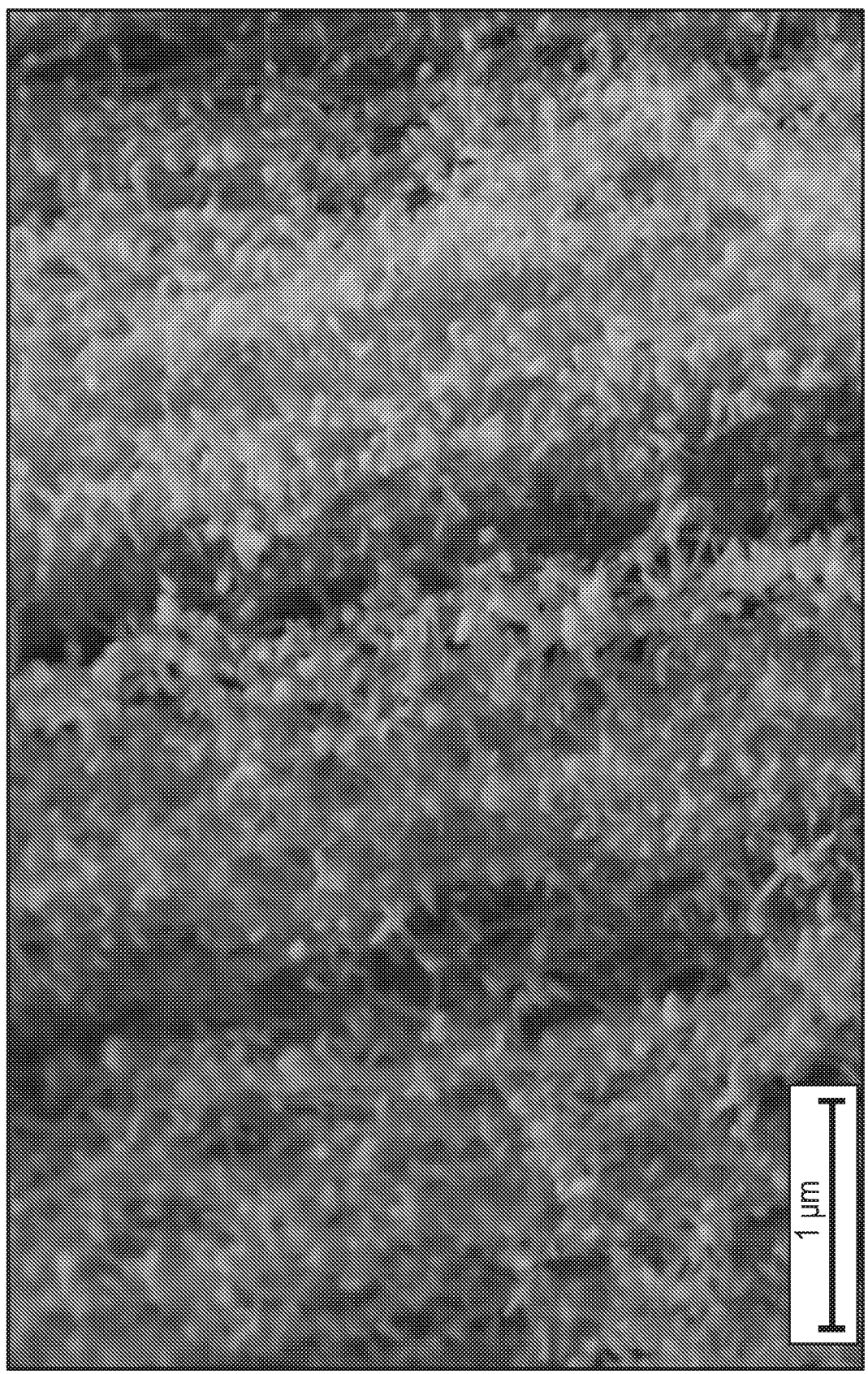
FIG. 5 is a further SEM image of carbon nanotubes with deposited copper particles
Figure 6:
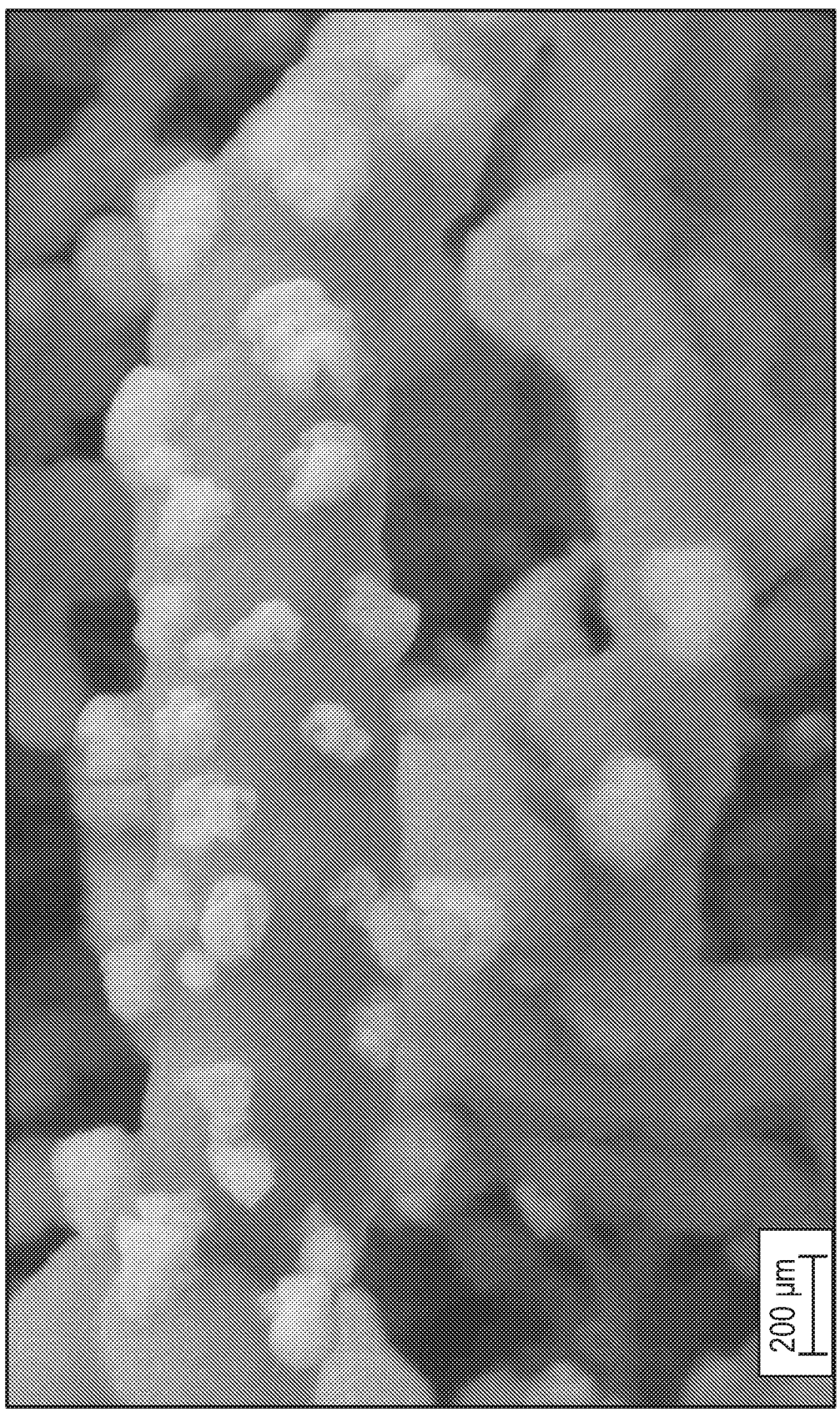
FIG. 6 is another SEM image of carbon nanotubes with deposited copper particles.

Copper Seeding:

When the sample is in position in the third chamber, the pressure is lowered again to 160 mbar, and a stream of precursor is injected in the chamber along the same process as for the silica deposition. The precursor solution injected is a 0.25 M solution of $Cu(acac)_2$ in toluene, with a pulse length of 0.7 ms and a frequency of 25 Hz. The carbon nanotube forest is then decorated by copper nanoparticles, as shown in FIG. 4, FIG. 5 and FIG. 6. This step allows a better deposition of the copper into the thickness of the carpet during the next step.

The third deposition chamber is then evacuated, flushed with argon and increased to atmospheric pressure. The sample holder is then extracted through a side door.

Optional Halogen Doping

Iodine is used as a doping halogen and is injected using a solution of iodoethane ($C_2H_5I$) in toluene: two parts of iodoethane for one part of toluene. The injection takes place during the copper seeding step. Firstly the copper precursor is injected for 20 minutes, then the iodine-containing solution is injected using the same parameters until 15 ml of solution has been injected, then copper injection is resumed.

Carbon Nanotube Orientation:

The coated foil ribbons are removed from the sample holder, and the carbon nanotube forest of both sides are laid down by passing the coated ribbon 2 in between two rotating smooth quartz cylinders 4, 6 along the width dimension of the ribbons, as illustrated in FIG. 7. This allows the carbon nanotubes to be oriented coaxially to the subsequent drawing process.

Copper Infiltration:

The ribbon 2 with the oriented carbon nanotube forest is then installed in a rack and dipped into an electroplating bath 7, as depicted in FIG. 8. This bath is composed of a solution of 0.56 mol/l $CuSO_4$ aqueous solution, with 0.67 mol/l sulphuric acid, 0.0027 mol/l sodium chloride. The volume of this solution in the bath is 250 ml with an addition of 5 ml of N-methyl pyrrolidone (NMP), 5 ml of methanol and 0.1 g sodium dodecyl sulphate (SDS). A current is established in between the coated copper ribbon and a pure copper anode in order to electroplate the carbon nanotube forest with copper. The current is imposed and the potential adjusted, as usually done for copper electroplating, and described in Schneider, Weiser, Dörfer et al. (2012), Surface Engineering, vol. 28, issue 6, pages 435 to 441. In order to improve the copper deposition inside the forest, the current follows a pulse-reversed pattern (as described in "Mechanical Properties of Carbon Nanotubes/Metal Composites" doctoral dissertation by Ying Sun, University of Central Florida, 2010), with a slight offset to maintain an electromigration force applied to the copper ions during the non-depositing time. FIG. 9 shows the typical pattern used, where Ic is the plating current, Is is the stripping current, with the offset allowing electromigration of the copper ions without plating. The fully plated carbon nanotubes are illustrated in FIG. 10.

Wire Drawing:

The insert is optionally first compressed (e.g. by using a rotational swaging machine or hot or cold rolling machine) until all voids in the insert are substantially eliminated.

The wire drawing process is carried out using a copper substrate that has a length of 300 mm and a width of 100 mm. This substrate has undergone the above steps to form laid down copper nanotubes on the two major opposing surfaces of the substrate. A bobbin 8 with a recessed region 10 for receiving the wound substrate is provided as shown in FIG. 11. The substrate 6 is then wound onto a bobbin 8 to form a bobbin of 18 mm in diameter. This is depicted in FIGS. 12 and 13. This bobbin 8 is slid into a sleeve 12 by sliding it into a cavity in one of the sleeve's ends. The sleeve has an outer diameter of 22 mm and a length of 500 mm and is depicted in FIG. 14. The sleeve 12 with the bobbin 8 inside is depicted in FIG. 15. The carbon nanotubes have been laid down to be substantially aligned along the length of the insert.

The insert is then drawn on a drawbench to achieve a 10% reduction in the insert's diameter, as depicted in FIG. 16. The drawn billet is then annealed in an argon atmosphere at a temperature of 550° C.

The steps of drawing and annealing are repeated until the insert's diameter has been reduced to 8 mm and the length has been increased to 3.75 m.

X-ray analysis is then conducted on the insert's ends so as to identify and cut off the sections that are pure copper (due to the greater length of the billet compared to the substrate prior to drawing). This insert is then run through a rod breakdown machine to reduce to the diameter to 2 mm. This is then drawn down to 1 mm using a wire drawing machine and the wire is then spooled. The final length of the wire in this example is approximately 50 m.

FIG. 17 shows a depiction of the final wire, where there is a copper matrix 14, within which there are layers of carbon nanotubes separated by layers which do not contain carbon nanotubes. The pattern of the carbon nanotube layers was introduced in the rolling up process.

FIG. 18 illustrates an SEM image of a wire drawn down to 1.5 mm. The image is a cross-section of the wire and shows at least 13 layers of carbon nanotubes along the radius of the wire. Detail of these layers is depicted in FIG. 19. An etched sample of this cross-section is shown in FIG. 20, where the alignment of the ends of the carbon nanotubes can be appreciated by the collection of carbon nanotubes at the centre of the image.

FIG. 21 illustrates a longitudinal section of the wire with substantial alignment of the carbon nanotubes in the centre of the images along the longitudinal direction of the carbon nanotubes.

In addition to the combination of features recited in the claims, the various features described herein can be combined in any compatible manner.

The invention claimed is:

1. A method for producing a conductive element precursor, the method comprising the following steps:
   growing a plurality of carbon nanotubes on a metallic substrate;
   applying a shear force to the plurality of carbon nanotubes on the metallic substrate in a first direction;
   coating carbon nanotubes of the plurality of carbon nanotubes on the metallic substrate with a metallic material; and wherein the step of applying the shear force occurs after the step of coating the carbon nanotubes.

2. The method of claim 1, wherein the step of coating the carbon nanotubes comprises chemical vapour deposition.

3. The method of claim 1, wherein the step of coating the carbon nanotubes comprises decorating the carbon nanotubes with the metallic material via chemical vapour deposition and then subsequently electroplating the carbon nanotubes with the metallic material.

4. The method of claim 1, wherein the metallic substrate is in the form of a foil.

5. The method of claim 1, wherein the metallic substrate and metallic material comprise copper.

6. A conductive element precursor formed by the method of claim 1.

7. A method for producing a conductive tape, the method comprising the following steps:
   forming the conductive element precursor according to claim 1;
   compressing the conductive element precursor such as to increase its length and form the conductive tape.

8. A method for producing an insert, the method comprising the following steps:
   forming the conductive element precursor according to claim 1; and
   rolling up the substrate with the coated carbon nanotubes to form the insert.

9. A method for producing a conductive element, the method comprising the following steps:
   forming the insert of claim 8; and
   drawing the insert to increase its length and form a conductive element.

10. A method for producing a conductive element, the method comprising the following steps:
    forming the conductive element precursor according to claim 1, wherein the forming of the conductive element precursor further comprises the step of
    rolling up the substrate with the coated carbon nanotubes to form an insert; and
    wherein the shear force is applied to the plurality of carbon nanotubes on the metallic substrate in a first direction by drawing the insert to increase its length and form the conductive element.

11. The method of claim 10, wherein the rolling step comprises rolling the substrate around a metallic bobbin and wherein the metallic bobbin with the rolled substrate thereon is placed in a metallic sleeve to form the insert.

12. The method of claim 11, wherein the metallic bobbin and the metallic sleeve comprise copper.

13. The method of claim 11, wherein the substrate with the coated carbon nanotubes is rolled round the bobbin such that the first direction is substantially parallel to the rotational axis of the bobbin.

14. The method of claim 10, wherein the first direction is substantially parallel to a drawing direction of the drawing step.

15. The method of claim 10, further comprising an annealing step following the drawing step.

16. The method of claim 10, wherein the conductive element is in the form of a wire.

17. The method of claim 1, wherein the step of growing a plurality of carbon nanotubes comprises chemical vapour deposition.

\* \* \* \* \*